(12) United States Patent
Norris

(10) Patent No.: US 6,511,330 B1
(45) Date of Patent: Jan. 28, 2003

(54) INTERCONNECT MODULE

(75) Inventor: Jeffrey J. Norris, Bloomington, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 0 days.

(21) Appl. No.: 09/939,203

(22) Filed: Aug. 24, 2001

(51) Int. Cl.⁷ .................................................. H01R 9/09
(52) U.S. Cl. ..................................... 439/76.1; 439/76.2
(58) Field of Search ........................... 439/76.1, 83, 79, 439/660, 701, 66, 82, 853, 378, 682, 686, 688, 709, 723, 76.2

(56) References Cited

U.S. PATENT DOCUMENTS

| | | | |
|---|---|---|---|
| 2,755,453 A | 7/1956 | Cloutier | |
| 3,230,493 A | 1/1966 | Jensen et al. | |
| 3,348,191 A | 10/1967 | Kinkaid | |
| 3,397,383 A | 8/1968 | Prifogle et al. | |
| 3,400,358 A | 9/1968 | Byrnes et al. | |
| 3,444,504 A | 5/1969 | Lynch et al. | |
| 3,470,529 A | 9/1969 | Klumpp, Jr. | |
| 3,551,874 A | * 12/1970 | Volinskie | 439/176 |
| 3,634,819 A | 1/1972 | Evans | |
| 3,731,261 A | 5/1973 | Spadoni, Jr. | |
| 3,862,792 A | 1/1975 | Jayne | |
| 3,997,237 A | 12/1976 | White | |
| 4,066,326 A | 1/1978 | Lovendusky | |
| 4,171,856 A | 10/1979 | Lynch | |
| 4,186,982 A | 2/1980 | Cobaugh et al. | |
| 4,230,384 A | 10/1980 | Anhalt | |
| 4,362,353 A | 12/1982 | Cobaugh et al. | |
| 4,384,757 A | 5/1983 | Andrews, Jr. et al. | |
| 4,655,518 A | 4/1987 | Johnson et al. | |
| 4,684,203 A | 8/1987 | Bihler | |
| 4,686,607 A | 8/1987 | Johnson | |
| 4,735,575 A | 4/1988 | Shaffer | |
| 4,749,357 A | 6/1988 | Foley | |
| 4,752,250 A | 6/1988 | Seidler | |
| 4,780,958 A | 11/1988 | Shaffer | |
| 4,815,991 A | 3/1989 | Bakke | |
| 4,824,380 A | 4/1989 | Matthews | |
| 4,857,018 A | 8/1989 | Pickles | |
| 4,869,677 A | 9/1989 | Johnson et al. | |
| 4,908,942 A | 3/1990 | Long et al. | |

(List continued on next page.)

FOREIGN PATENT DOCUMENTS

| | | |
|---|---|---|
| DK | 3533339 | 6/1987 |
| WO | PCT/US87/01810 | 7/1987 |

Primary Examiner—Renee Luebke
Assistant Examiner—Phuong Nguyen
(74) Attorney, Agent, or Firm—Merchant & Gould P.C.

(57) ABSTRACT

A mount apparatus includes a separate spring contact and wire wrap pin assembly as well as having a sandwich construction to prevent the spring contact and wire wrap pin from being pushed out of their retention positions. In one embodiment, a mount apparatus includes a front cover having a plurality of receptacles, a back cover having a plurality of through holes, and a circuit board assembly sandwiched between the front cover and the back cover. The circuit board assembly includes a board having a plurality of through holes aligned with the receptacles of the front cover and the through holes of the back cover, a plurality of contacts retained in a first set of the through holes of the board of the circuit board assembly, and a plurality of pins retained in a second set of the through holes of the board of the circuit board assembly. A first end of each contact is extended towards and exposed in a corresponding receptacle of the front cover and stopped by the front cover, and a second end of each contact is extended towards and stopped by the back cover. A first end of each pin is extended towards and stopped by the front cover, and a second end of each pin is extended towards and projected from a corresponding through hole of the back cover. Further, the circuit board assembly includes a trace electrically connecting each contact to each corresponding pin.

14 Claims, 22 Drawing Sheets

U.S. PATENT DOCUMENTS

| | | |
|---|---|---|
| 5,004,426 A | 4/1991 | Barnett |
| 5,004,438 A | 4/1991 | Cabourne |
| 5,026,293 A * | 6/1991 | Wilson ........................ 439/76 |
| 5,055,055 A | 10/1991 | Bakker |
| 5,145,383 A | 9/1992 | Bowen et al. |
| 5,240,422 A | 8/1993 | Kobayashi et al. |
| 5,374,204 A | 12/1994 | Foley et al. |
| 5,452,512 A | 9/1995 | Foley et al. |
| 5,761,050 A | 6/1998 | Archer |
| 5,816,855 A | 10/1998 | Pesson |
| 6,053,764 A * | 4/2000 | Curry et al. ................ 439/557 |

* cited by examiner

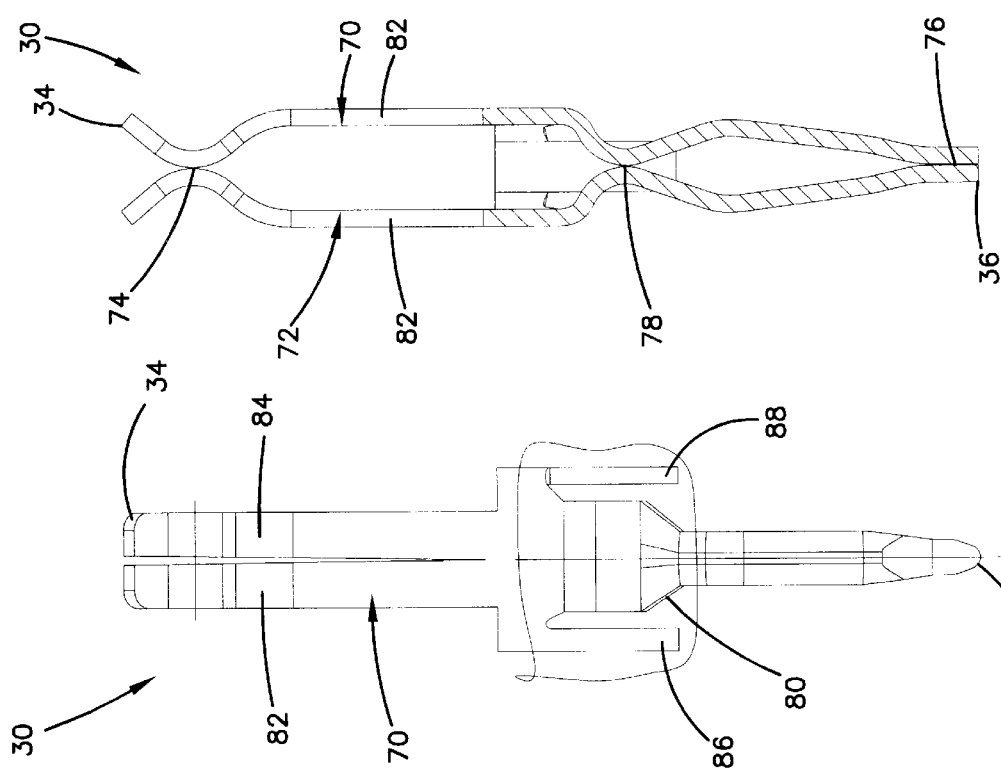
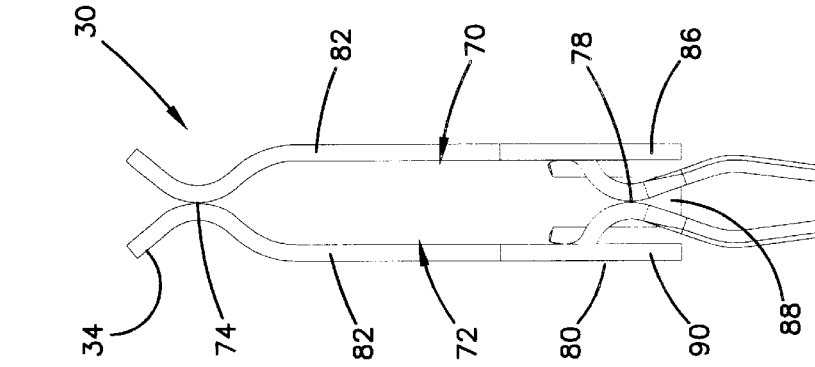
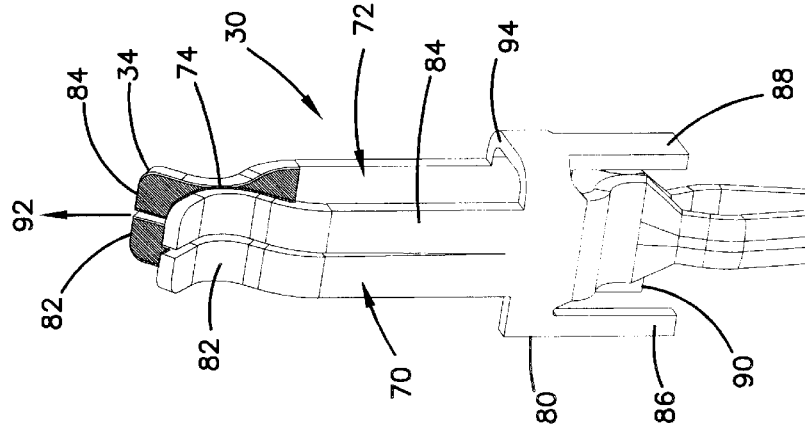

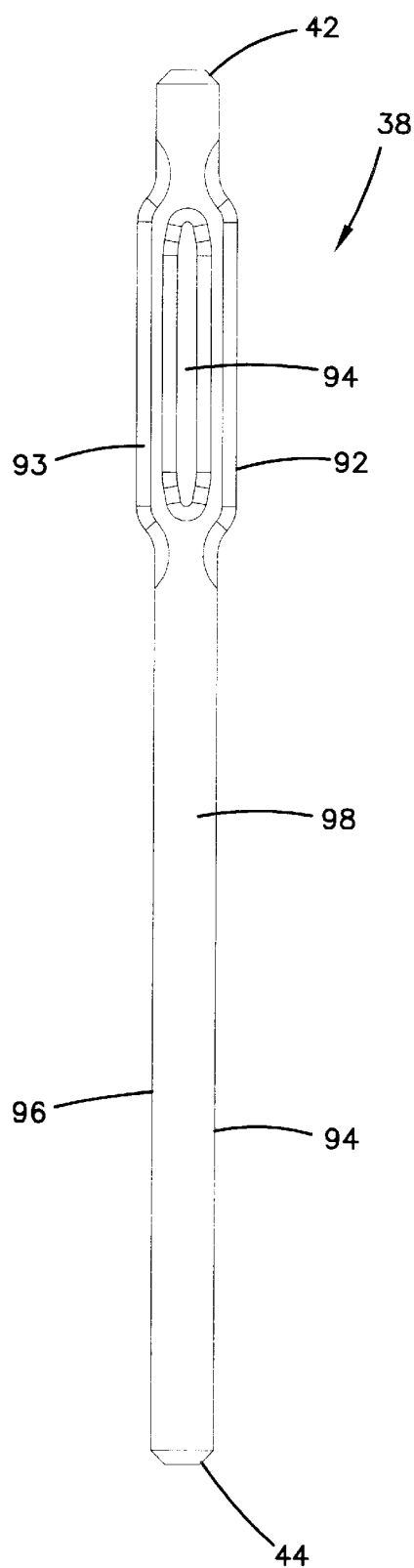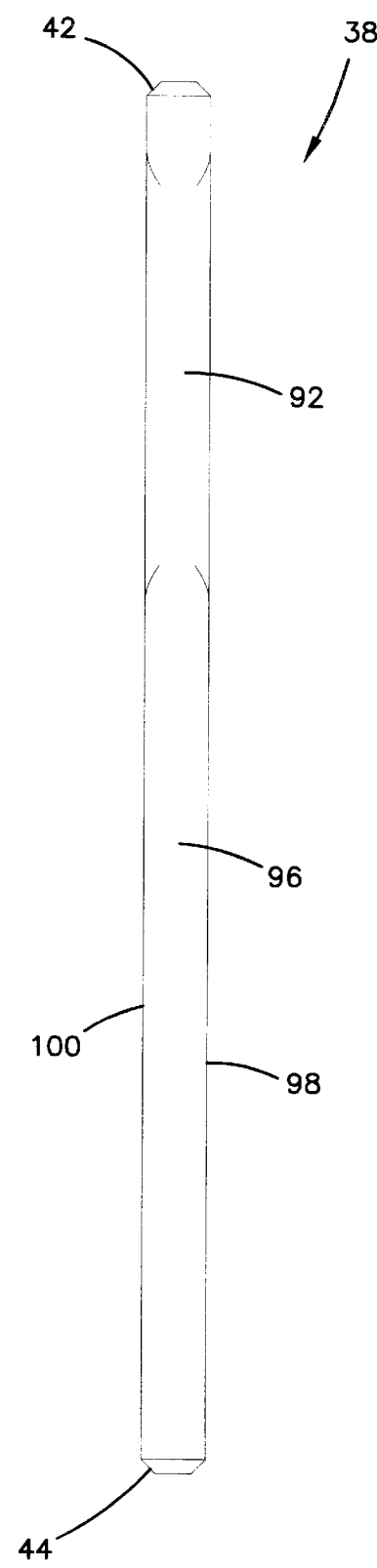

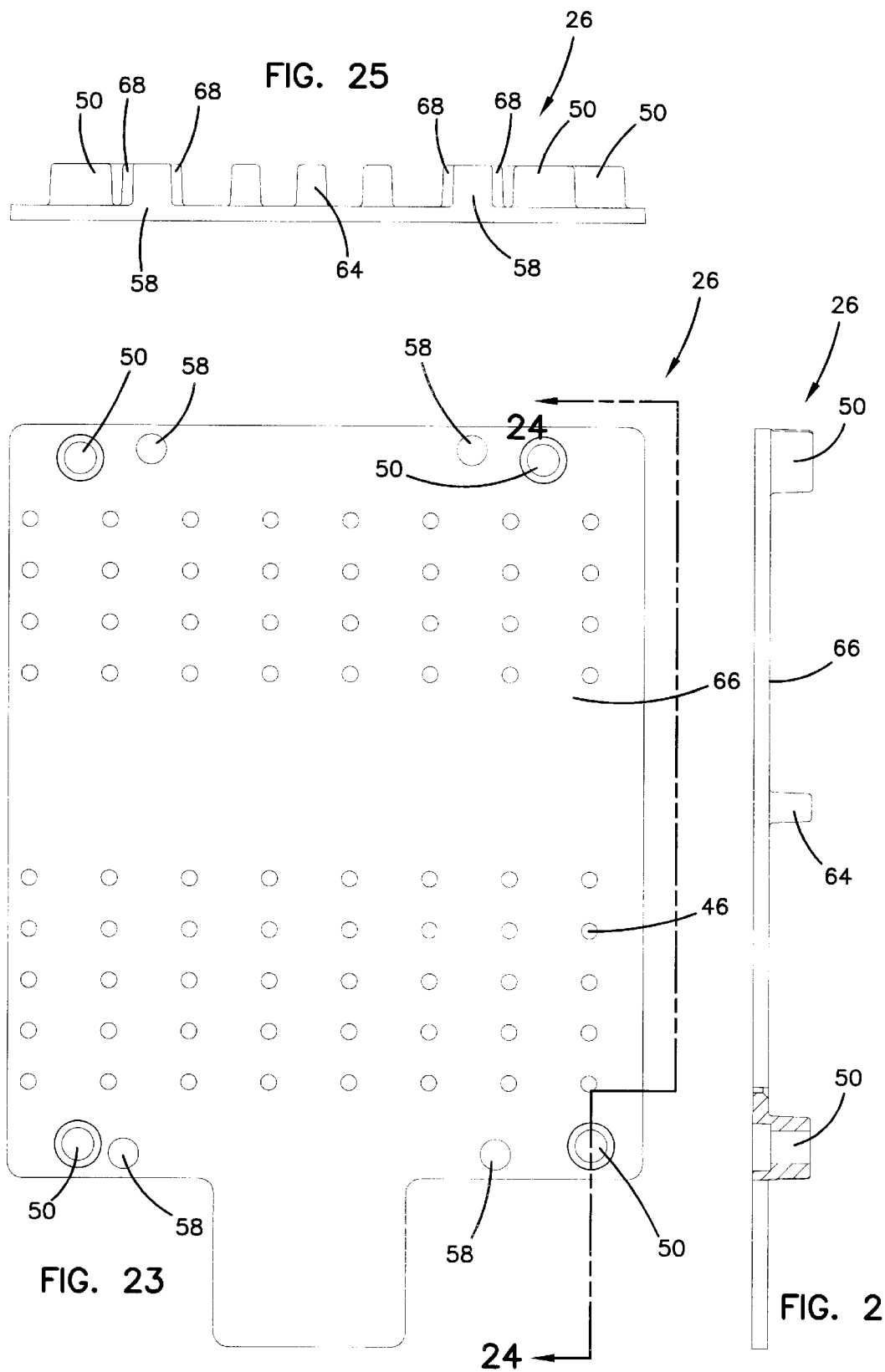

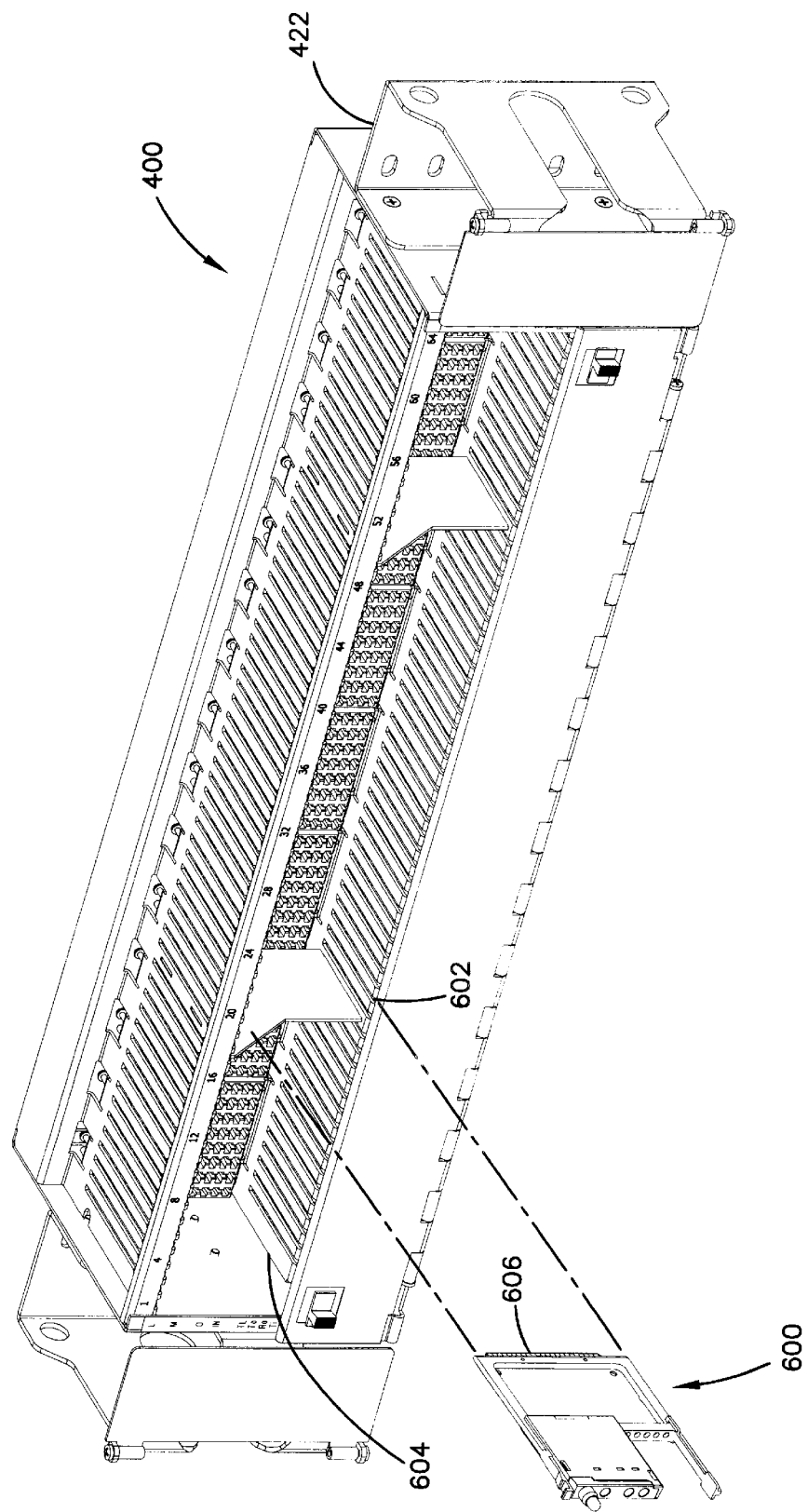

INTERCONNECT MODULE

FIELD OF THE INVENTION

The present invention relates to cross-connect systems and, in particular, to a mount apparatus for a jack assembly in a digital cross-connect system.

BACKGROUND

A digital cross-connect system (DSX) provides a location for interconnecting two digital transmission paths. DSX is generally located in one or more frames or bays in a central office, e.g. a central telephone office. DSX also provides jack access to the transmission paths.

DSX jacks are known in the art to provide spring contacts for receiving tip and ring plugs. The jacks are commonly ganged in a common housing that is mounted on a frame. The jacks are typically hard wired to wire termination pins or other connection locations that are mounted on a side of the housing opposite plug access openings.

Recent DSX systems include U.S. Pat. No. 4,840,568 (the '568 patent) and U.S. Pat. No. 5,393,249 (the '249 patent), commonly assigned to ADC Telecommunications, Inc., and are incorporated herein by reference. In assembling a DSX system as in the '568 patent, an operator typically uses a wire wrap gun to drive a wire or cable onto a wire wrap pin that extends from a back side of the mount. The opposite end of the wire wrap pin is a spring contact for contacting an electrical contact of a jack circuit board. During assembly, it might be possible for the operator to apply excessive force in driving the wire or cable onto a wire wrap pin/spring contact. The excessive force tends to push the wire wrap pin/spring contact out of a retention position on the mount.

U.S. Pat. No. 5,374,204 (the '204 patent) describes an electrical terminal with a compliant pin section. This patent describes transition sections that resist movement of the pin leg sections toward each other. This movement generates an outwardly directed spring force normal to the planes of the leg sections. In other words, the pin leg sections are designed to have a gap therebetween and the transition sections are designed to keep the gap between the pin leg sections thus creating a spring force. This type of a compliant pin has disadvantageous. One such disadvantage is that the creation of a spring force as described can weaken the spring force exerted at an opposite end of the compliant pin.

Therefore, improvements are desired.

SUMMARY

One aspect of the present disclosure relates to a mount apparatus having a separate spring contact and wire wrap pin assembly as well as having a multi-layer or sandwich construction to prevent the spring contact and wire wrap pin from being pushed out of their retention positions.

In one embodiment of the present disclosure, a mount apparatus includes a front cover having a plurality of receptacles, a back cover having a plurality of through holes, and a circuit board assembly sandwiched between the front cover and the back cover. The circuit board assembly includes a board having a plurality of through holes aligned with the receptacles of the front cover and the through holes of the back cover, a plurality of contacts retained in a first set of the through holes of the board of the circuit board assembly, and a plurality of pins retained in a second set of the through holes of the board of the circuit board assembly. A first end of each contact is extended towards and exposed in a corresponding receptacle of the front cover and stopped by the front cover, and a second end of each contact is extended towards and stopped by the back cover. A first end of each pin is extended towards and stopped by the front cover, and a second end of each pin is extended towards and projected from a corresponding through hole of the back cover. Further, the circuit board assembly includes a trace electrically connecting each contact to each corresponding pin.

Another aspect of the present disclosure relates to a jack assembly for a cross-connect system, for example a DSX system, which not only incorporates electronic component surface mount technology into the jack assembly, but also permits an operator to perform desired cross-connect wiring without need to access a rear portion of the system.

In one example embodiment of the present disclosure, the jack assembly includes a jack circuit board having a plurality of electrical contacts at one side, a plurality of electrical wires, a jack mount for mounting the jack circuit board and electrically cross-connecting the electrical contacts of the jack circuit board to the electrical wires. The jack mount includes a front cover having a plurality of receptacles, a back cover having a plurality of through holes, a circuit board assembly sandwiched between the front cover and the back cover. The circuit board assembly includes a board having a plurality of through holes aligned with the receptacles of the front cover and the through holes of the back cover, a plurality of contacts retained in a first set of the through holes of the board of the circuit board assembly, and a plurality of pins retained in a second set of the through holes of the board of the circuit board assembly. A first end of each contact is extended towards and exposed in a corresponding receptacle of the front cover and stopped by the front cover, and a second end of each contact is extended towards and stopped by the back cover. A first end of each pin is extended towards and stopped by the front cover, and a second end of each pin is extended towards and projected from a corresponding through hole of the back cover. Further, the circuit board assembly includes a trace electrically connecting each contact to each corresponding pin. The electrical contacts of the jack circuit board are electrically connected to the contacts of the circuit board assembly of the jack mount. Accordingly, the electrical wires are electrically connected to the pins of the circuit board assembly of the jack mount.

In addition to many other advantages, the present disclosure provides a more robust mount apparatus for a jack assembly in a cross-connect system.

A further aspect of the present disclosure relates to a method of cross-connect wiring a first cable to a second cable. In one embodiment, the method includes the step of providing a jack circuit board having an electrical contact at a first side and a termination pin at a second side, the first cable being coupled to the termination pin at the second side of the jack circuit board, the step of providing a mount having a front cover, a back cover, and a circuit board assembly sandwiched between the front and back covers, the front cover, back cover, and circuit board assembly being configured and arranged to retain a spring contact and a wire wrap pin on the circuit board assembly, the spring contact and the wire wrap pin being physically separate from each other and electrically in contact via a trace disposed on the circuit board assembly, the step of wiring the second cable onto the wire wrap pin which extends from a back side of the mount, and the step of sliding the first side of the jack circuit board onto the front cover of the mount wherein the electrical contact of the jack circuit board is coupled to the spring contact of the circuit board assembly of the mount.

The method further includes the step of replacing the jack circuit board with a second jack circuit board, the second jack circuit board having an electrical contact at a first side and a termination pin at a second side, a third cable being coupled to the termination pin at the second side of the second jack circuit board. The replacing step includes the step of pulling the jack circuit board out of the mount, and the step of sliding the first side of the second jack circuit board onto the front cover of the mount wherein the electrical contact of the second jack circuit board is coupled to the spring contact of the circuit board assembly of the mount, whereby cross-connect wiring between the second and third cables can be performed without need for access to the back side of the mount.

Another aspect of the present disclosure includes an electrical terminal adapted for insertion into a through hole of a circuit board. The electrical terminal includes a first section, a second section, and a third section. The first section receives an electrical contact and has first and second spring arms proximate to each other at a contact point and are configured to exert a spring force to retain the electrical contact. The second section is adapted for insertion into the through hole of the circuit board. The second section has first and second pin members proximate to each other. The first and second pin sections define slots configured to exert a spring force to retain the electrical terminal in the through hole of the circuit board. The third section is integral with the first and second sections. The third section has a plurality of stop members configured to prevent the electrical terminal from being pushed through the through hole of the circuit board.

Another aspect of the present disclosure includes a system. The system includes a frame and a mount apparatus. The mount apparatus includes features previously described.

Another aspect of the present disclosure includes a mount apparatus for use in a cross-connect system. The mount apparatus includes a front cover having a plurality of receptacles, a back cover having a plurality of through holes, and a circuit board assembly sandwiched between the front cover and the back cover, the circuit board assembly includes a board having a plurality of through holes aligned with the receptacles of the front cover and the through holes of the back cover. The circuit board assembly also includes a plurality of contacts retained in a first set of the through holes of the board of the circuit board assembly. A first end of each contact is extended towards and exposed in a corresponding receptacle of the front cover and stopped by the front cover. A second end of each contact is extended towards and projects towards the back cover. The assembly further includes a plurality of pins retained in a second set of the through holes of the board of the circuit board assembly. A first end of the each pin is extended towards and stopped by the front cover. A second end of each pin is extended towards and projected from a corresponding through hole of the back cover. A trace electrically connects each contact to each corresponding pin.

Another aspect of the present disclosure includes a mount apparatus that includes a front cover, having a plurality of receptacles, a back cover, having a plurality of through holes, and a circuit board assembly sandwiched between the front cover and the back cover. The circuit board assembly includes a board having a plurality of through holes aligned with the receptacles of the front cover and the through holes of the back cover and includes a plurality of contacts retained in a first set of the through holes of the board of the circuit board assembly. A first end of each contact is extended towards and exposed in a corresponding receptacle of the front cover and stopped by the front cover. A second end of each contact is extended towards and projects toward the back cover.

BRIEF DESCRIPTION OF THE DRAWINGS

Referring now to the drawings in which like reference numbers represent corresponding parts throughout:

FIG. 8 is a perspective view showing front, top, and right sides of one embodiment of a spring contact of the circuit board assembly of FIG. 5;

FIG. 9 is a left side view of the spring contact of FIG. 8;

FIG. 10 is a front side view of the spring contact of FIG. 8;

FIG. 13 is a cross-sectional view of the spring contact of FIG. 10;

FIG. 14 is a front side view of one embodiment of a wire wrap pin of the circuit board assembly of FIG. 5;

FIG. 15 is a left side view of the wire wrap pin of FIG. 14;

FIG. 23 is a backside view of the back cover of FIG. 1;

FIG. 24 is a right side view of the back cover of FIG. 1;

FIG. 25 is a topside view of the back cover of FIG. 1;

FIG. 36 is a perspective view of the chassis of FIG. 32 and a jack assembly for insertion into the chassis.

DETAILED DESCRIPTION

The mount apparatus of the present disclosure receives a jack assembly in a cross-connect system and retains separate spring contacts and wire wrap pins of the mount apparatus. The mount apparatus is configured and arranged in a multilayer or sandwich construction to prevent the spring contacts and wire wrap pins from being pushed out of their retention positions.

Figure 1:
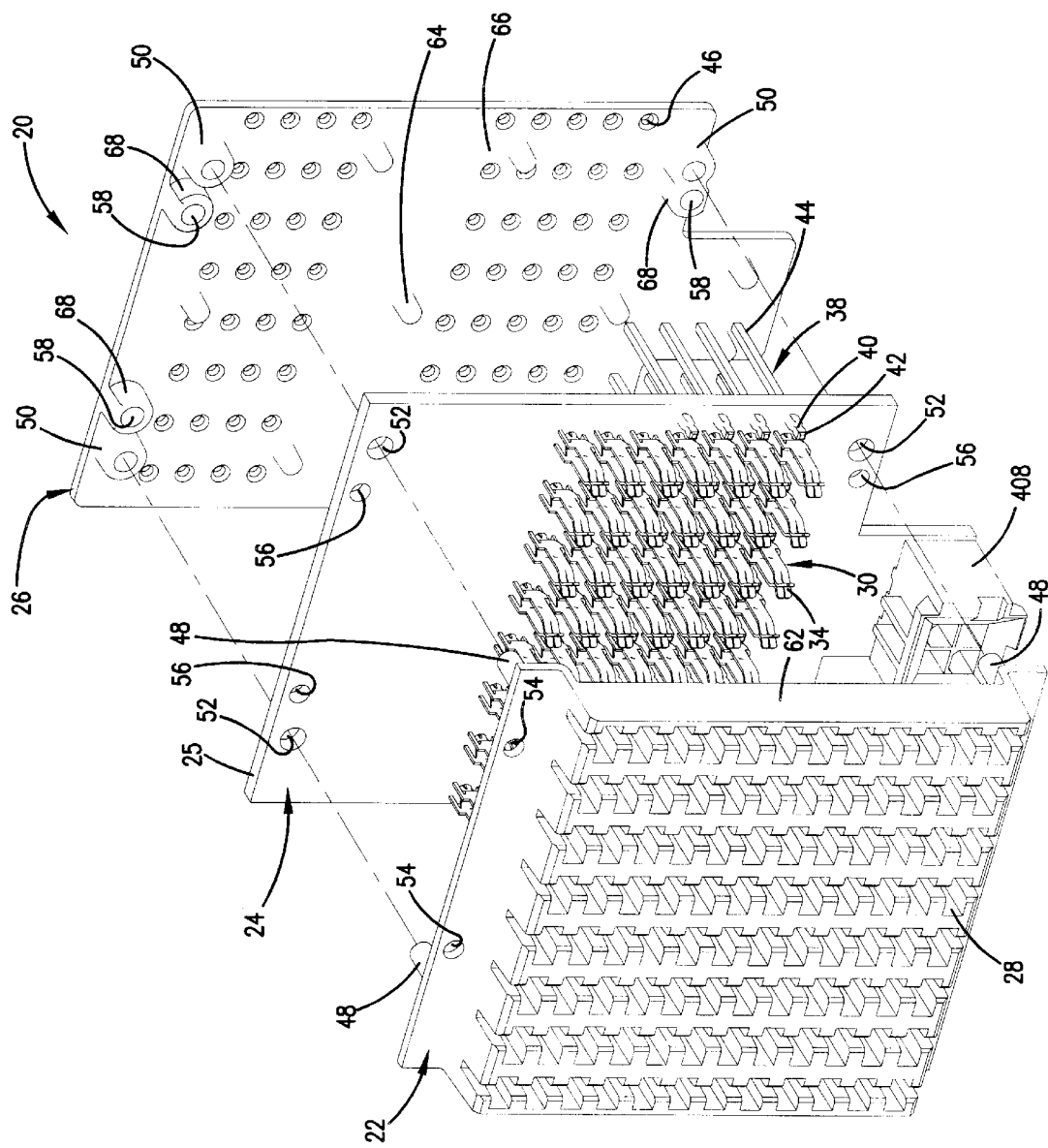
FIG. 1 is an exploded perspective view showing front, top, and right sides of one embodiment of a mount apparatus having a front cover, a circuit board assembly, and a back cover in accordance with the present invention.
Figure 2:
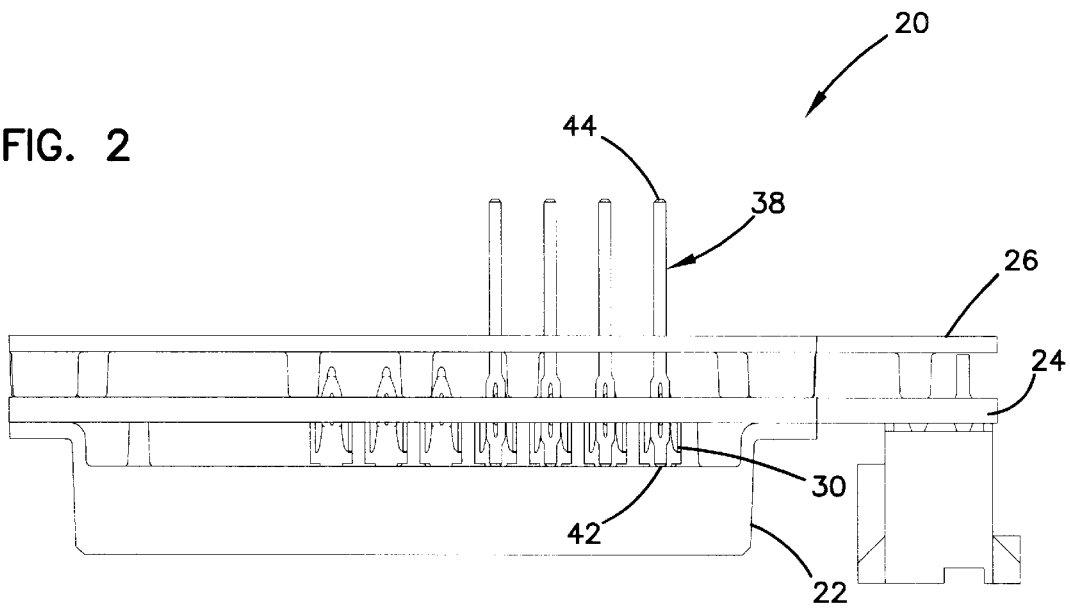
FIG. 2 is a left side view of the mount apparatus of FIG. 1.
Figure 4:
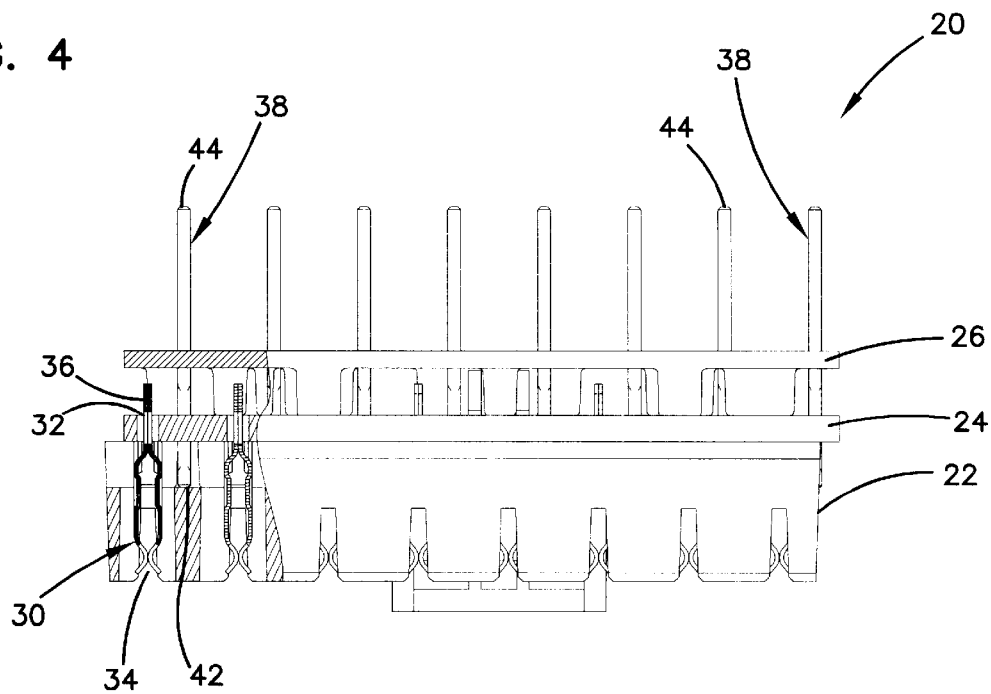
FIG. 4 is a bottom side view of the mounted apparatus of FIG. 1.
Figure 3:
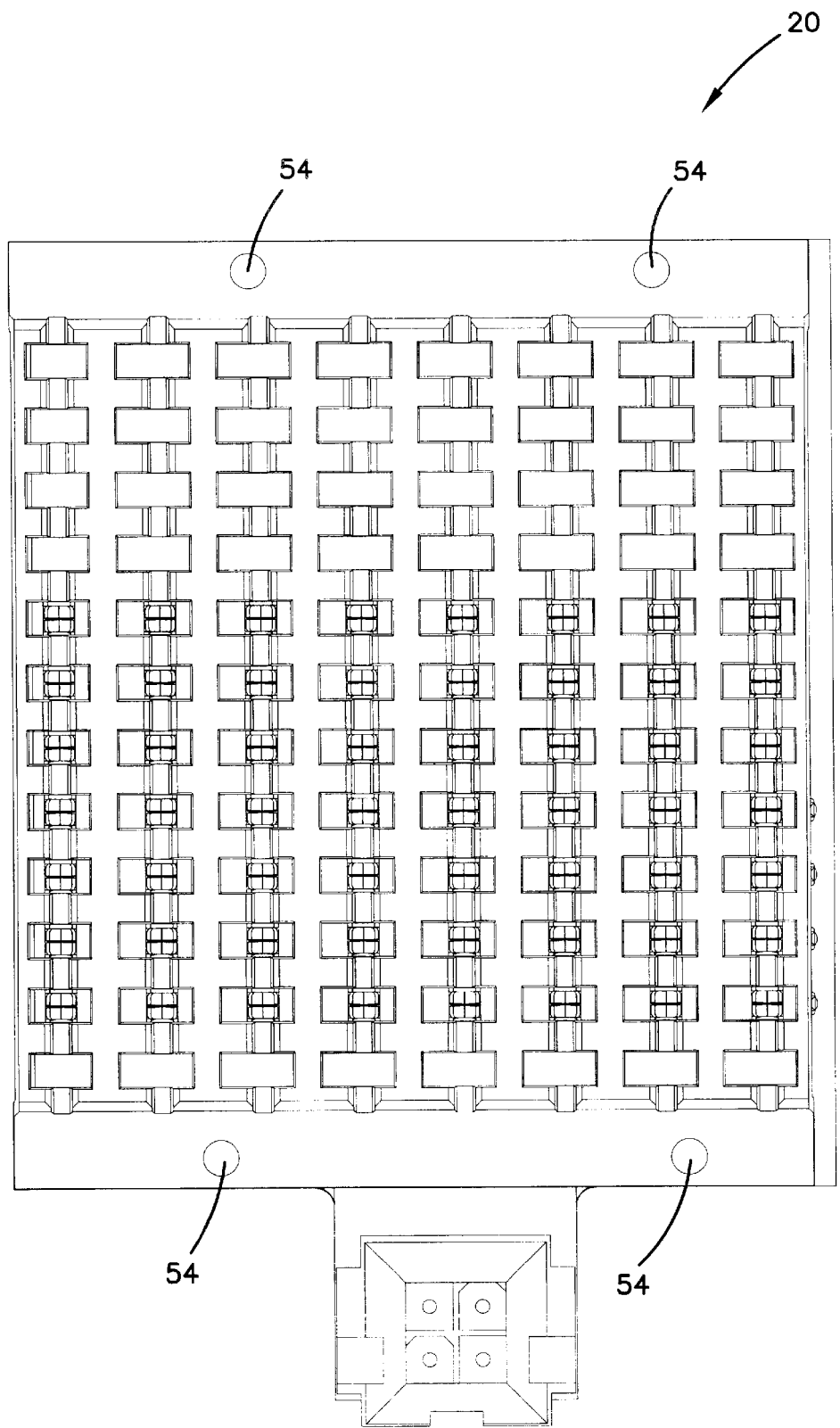
FIG. 3 is a front side view of the mount apparatus of FIG. 1.
Figure 5:
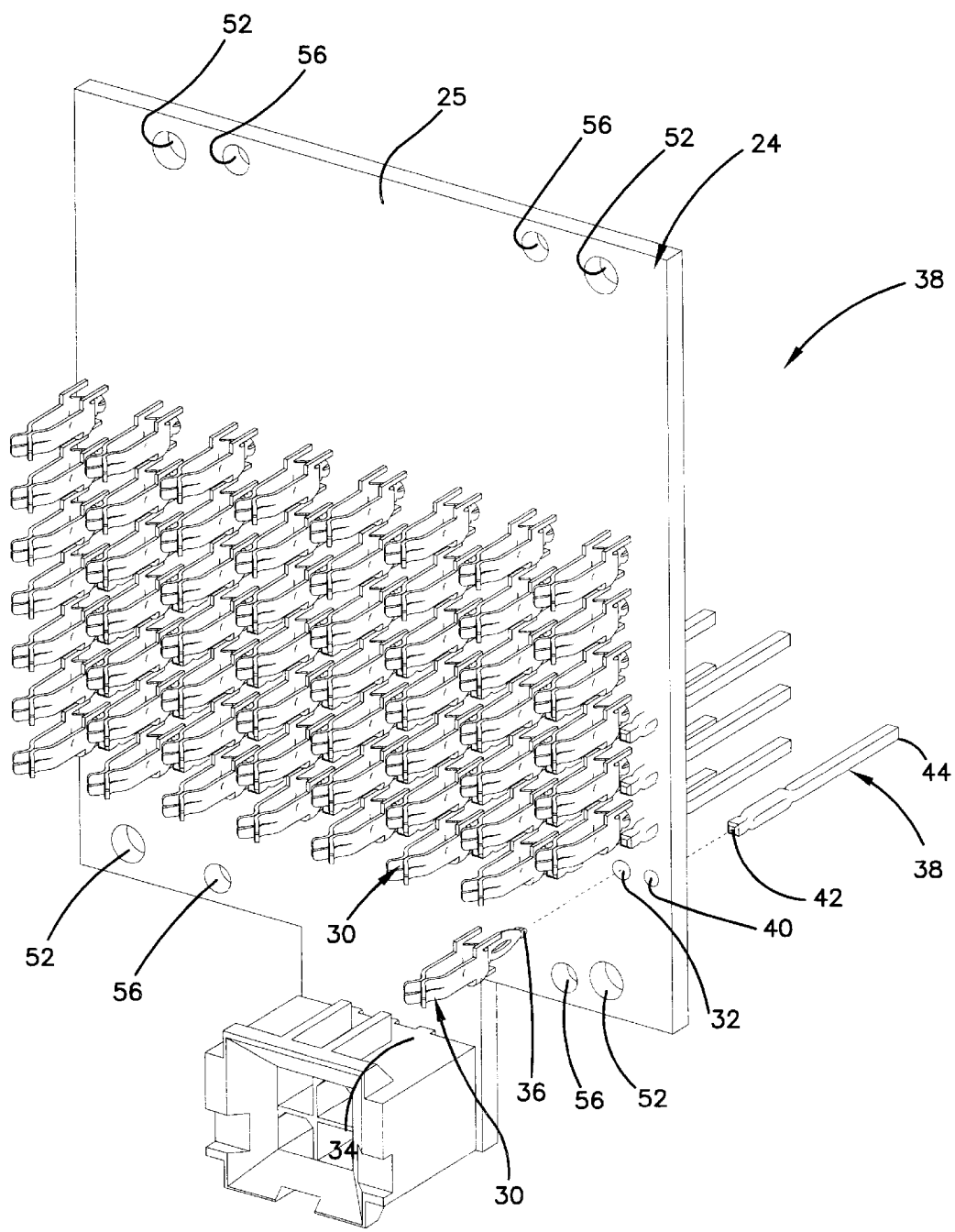
FIG. 5 is a perspective view showing front, top, and right sides of one embodiment of a circuit board assembly of the mount apparatus of FIG. 1.
Figure 6:
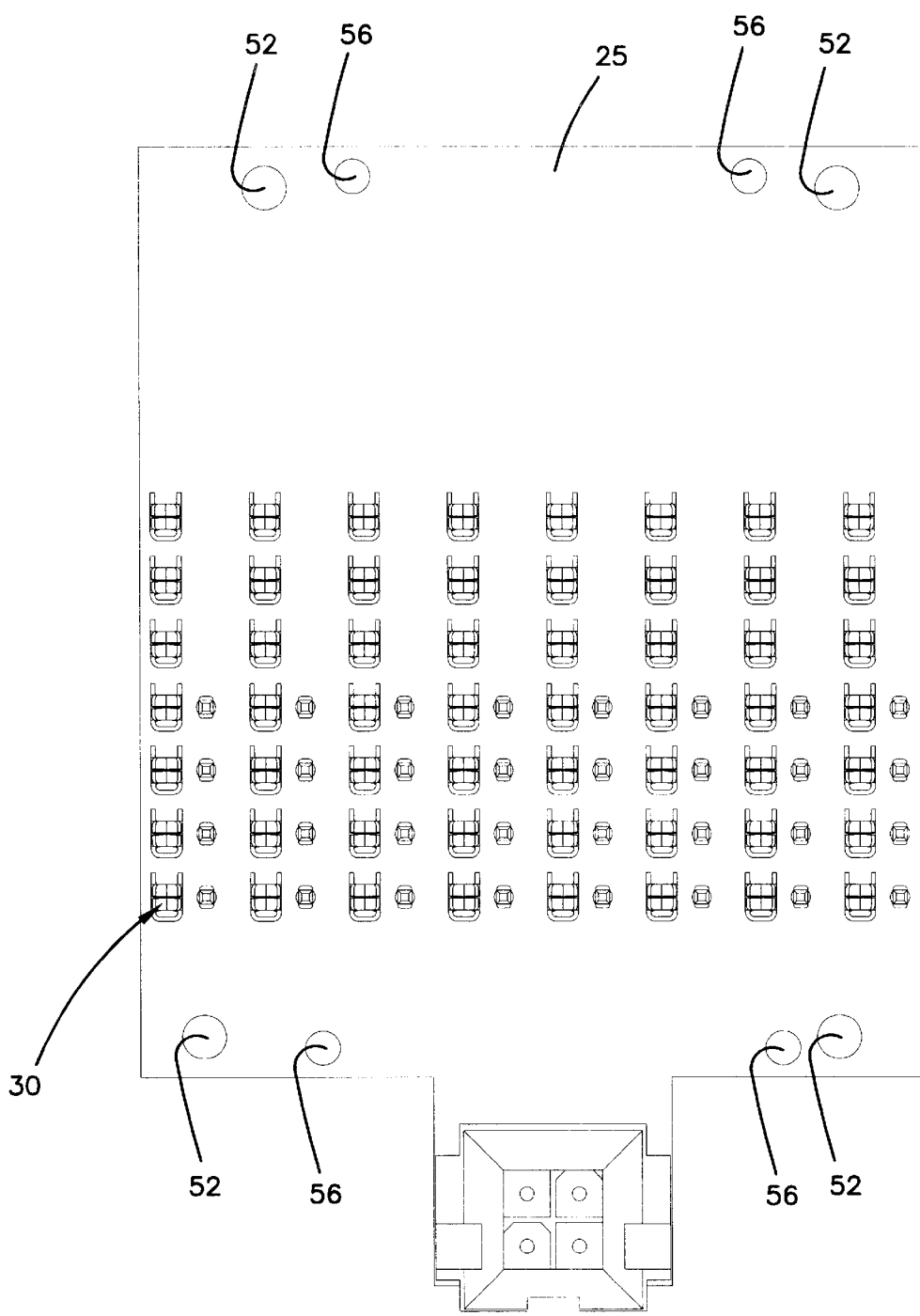
FIG. 6 is a front side view of the circuit board assembly of FIG. 5.

Referring now to the figures, one example embodiment of a mount apparatus 20 is shown in FIG. 1 in exploded view. The mount apparatus 20 includes a front cover 22, a circuit board assembly 24, and a back cover 26. The circuit board assembly 24 is sandwiched between the front cover 22 and the back cover 26. The front cover 22 of the mount apparatus 20 includes arrays of receptacles 28 capable of receiving a plurality of jack circuit boards as shown in the '568 patent and the '249 patent herein incorporated by reference in their entirety. As shown in these patents, a jack circuit board includes, at one end, a plurality of jack ports capable of electrically coupling to plugs on the ends of cables or wires, and at the other end, a plurality of electrical contacts to be received in the receptacles 28 and to be in electrical contact with spring contacts 30 disposed in the receptacles 28.

Figure 7:
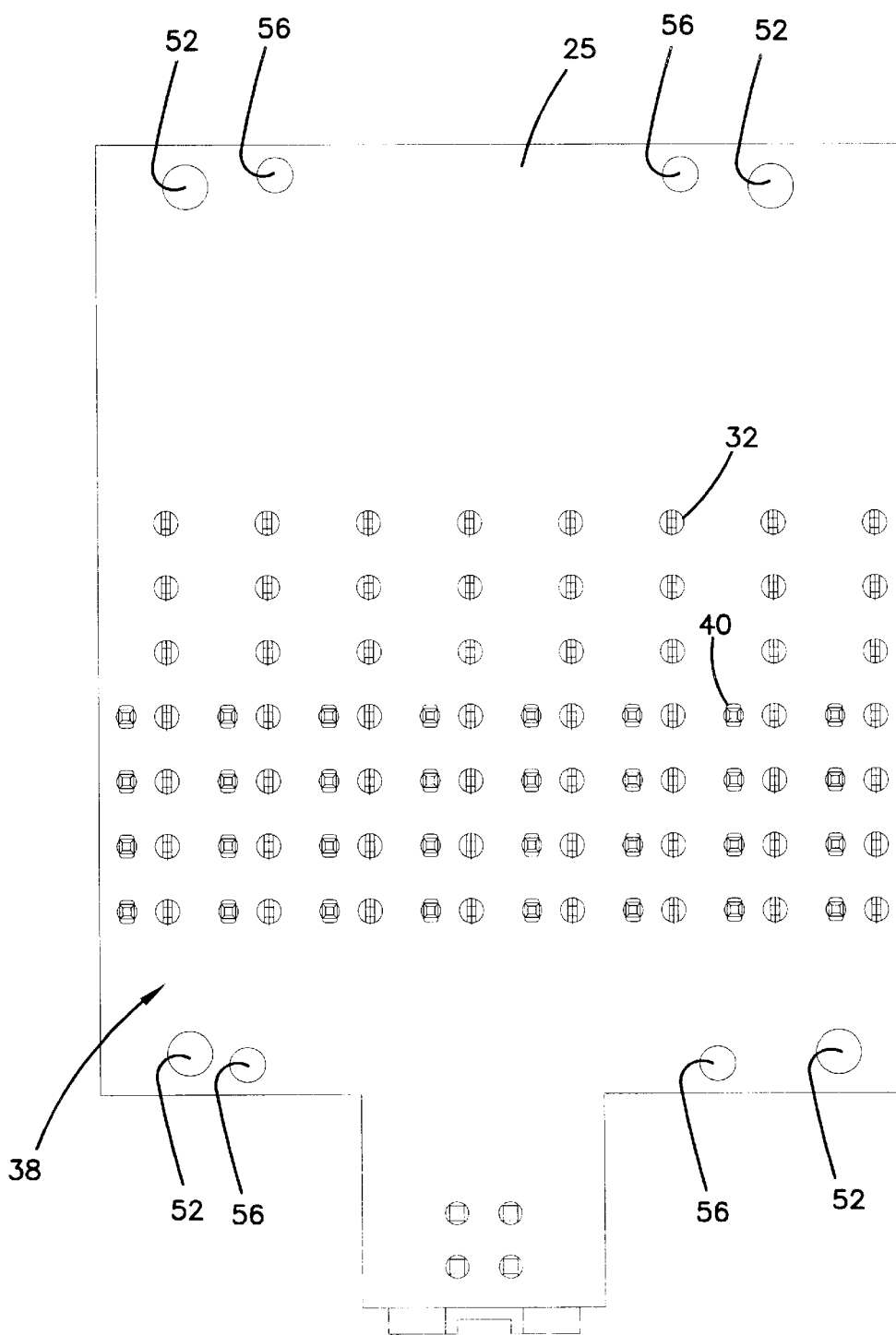
FIG. 7 is a backside view of the circuit board assembly of FIG. 5.
Figure 12:
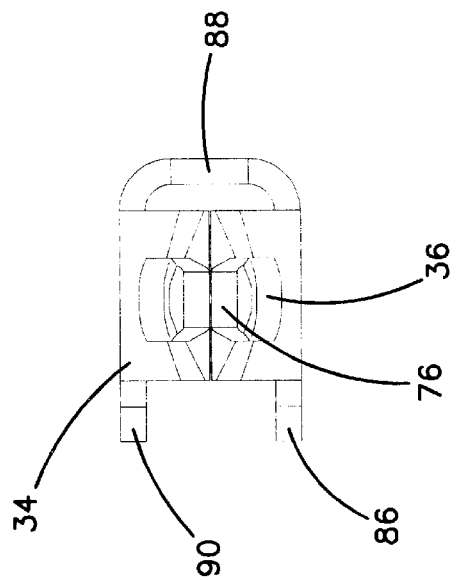
FIG. 12 is a bottom side view of the spring contact of FIG. 8.
Figure 11:
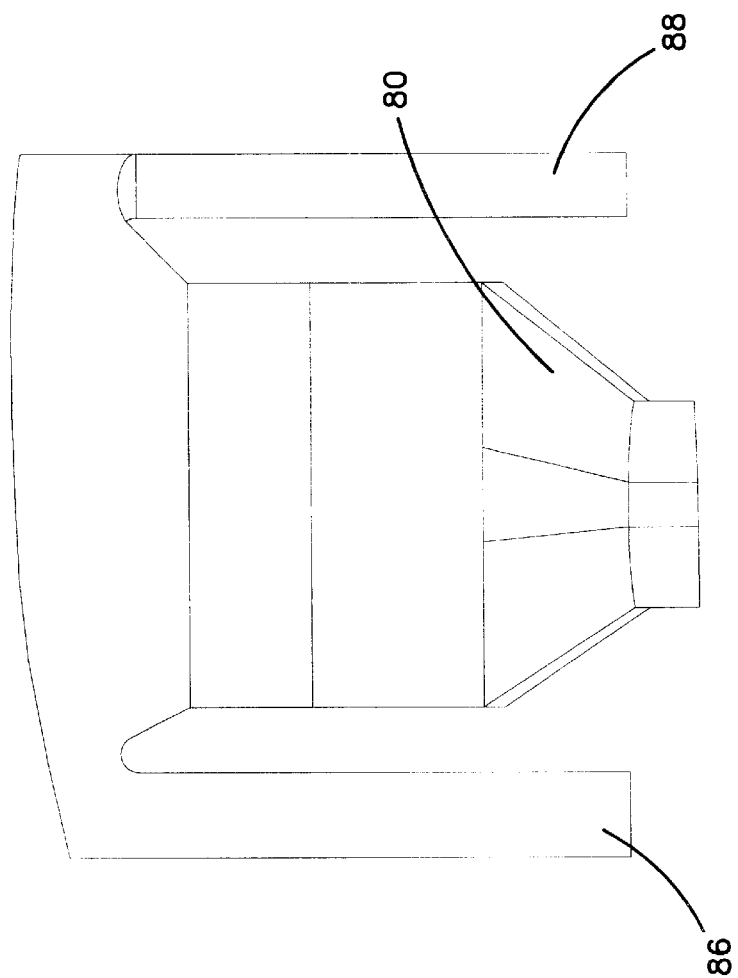
FIG. 11 is an enlarged view of a middle portion of the spring contact of FIG. 10.
Figure 16:
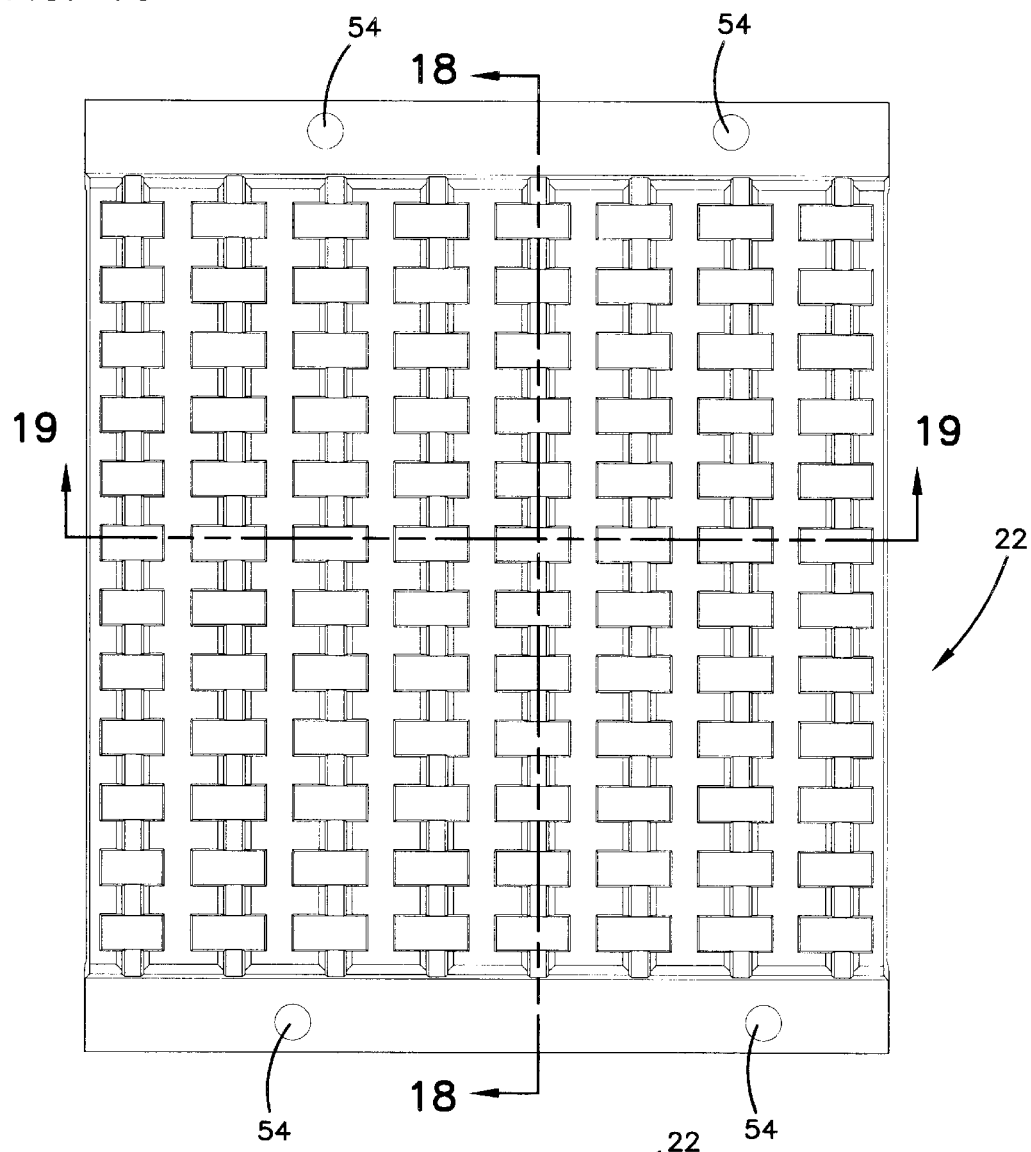
FIG. 16 is a front side view of one embodiment of the front cover of FIG. 1.
Figure 19:
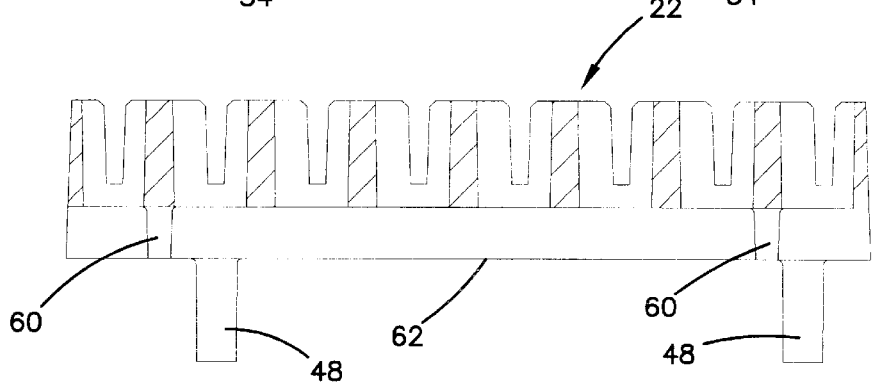
FIG. 19 is a bottom side view of the front cover of FIG. 1.
Figure 17:
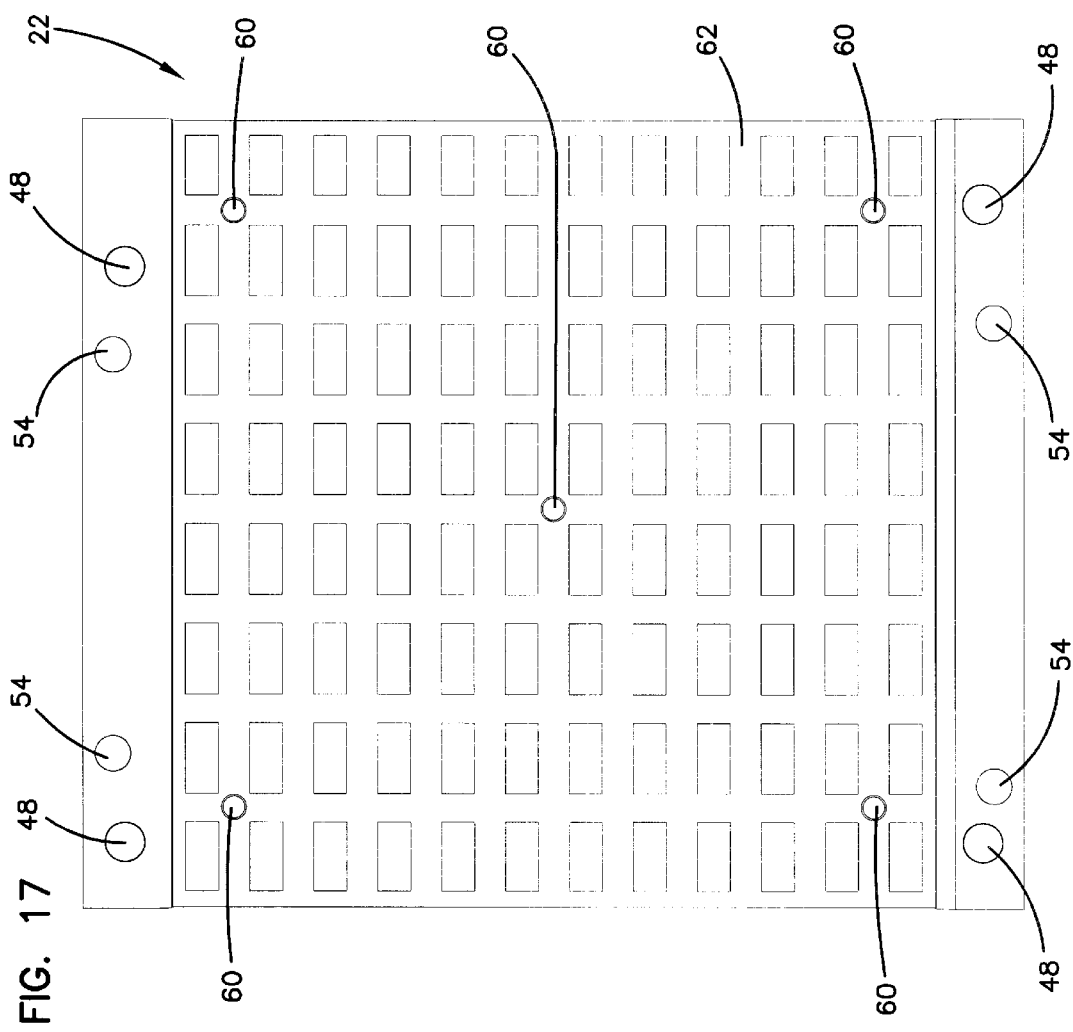
FIG. 17 is a backside view of the front cover of FIG. 1.
Figure 18:
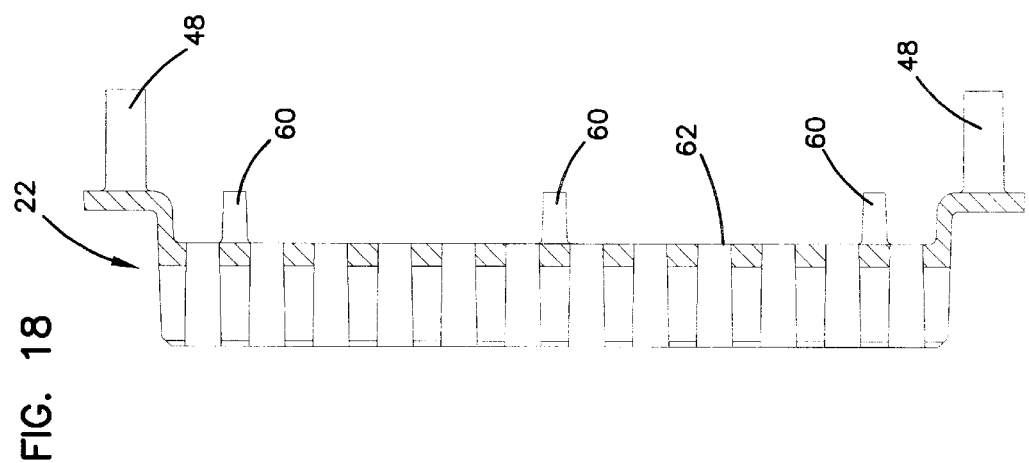
FIG. 18 is a right side view of the front cover of FIG. 1.
Figure 20:
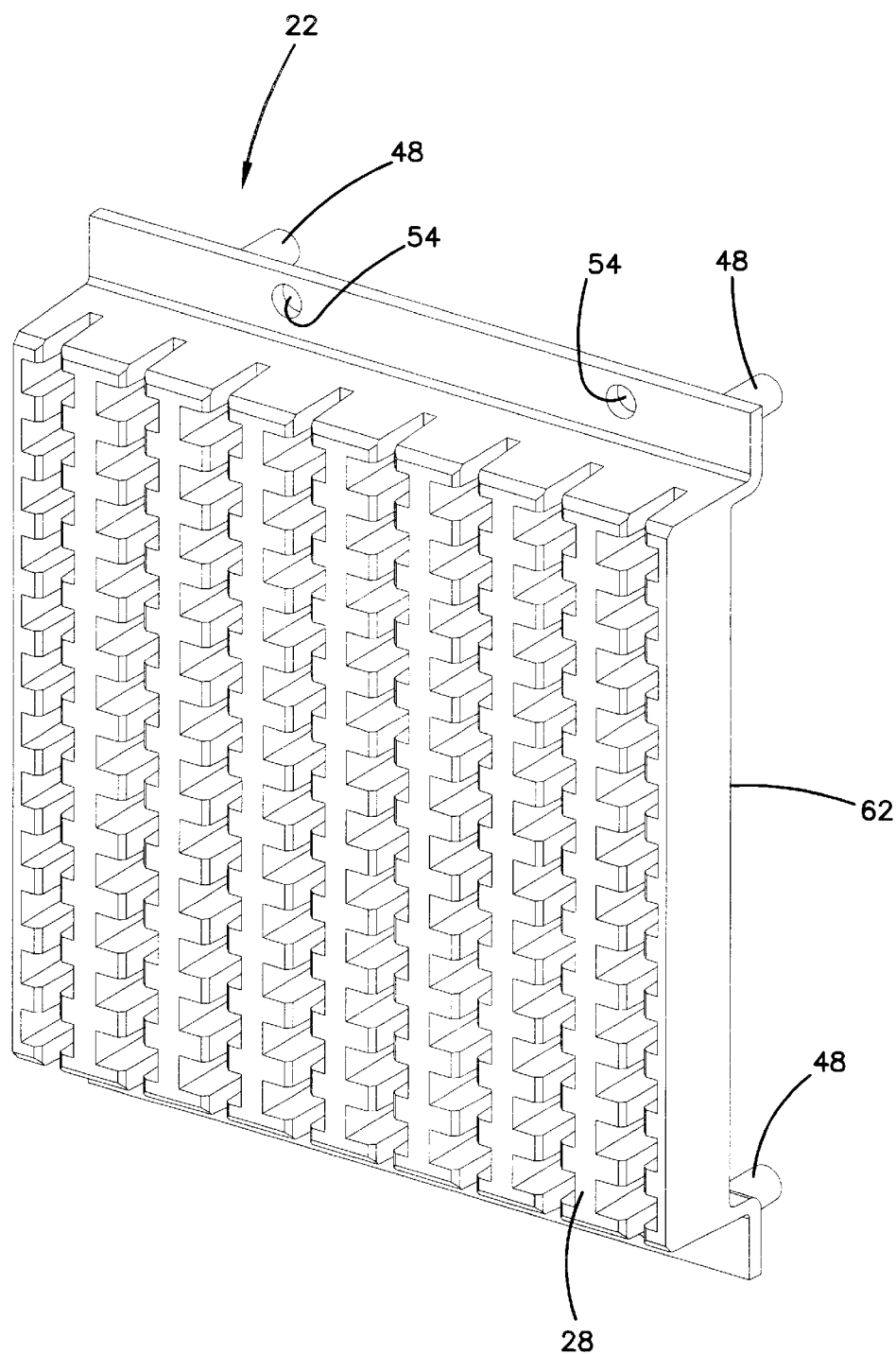
FIG. 20 is a perspective view showing front, top, and right sides of the front cover of FIG. 1.
Figure 21:
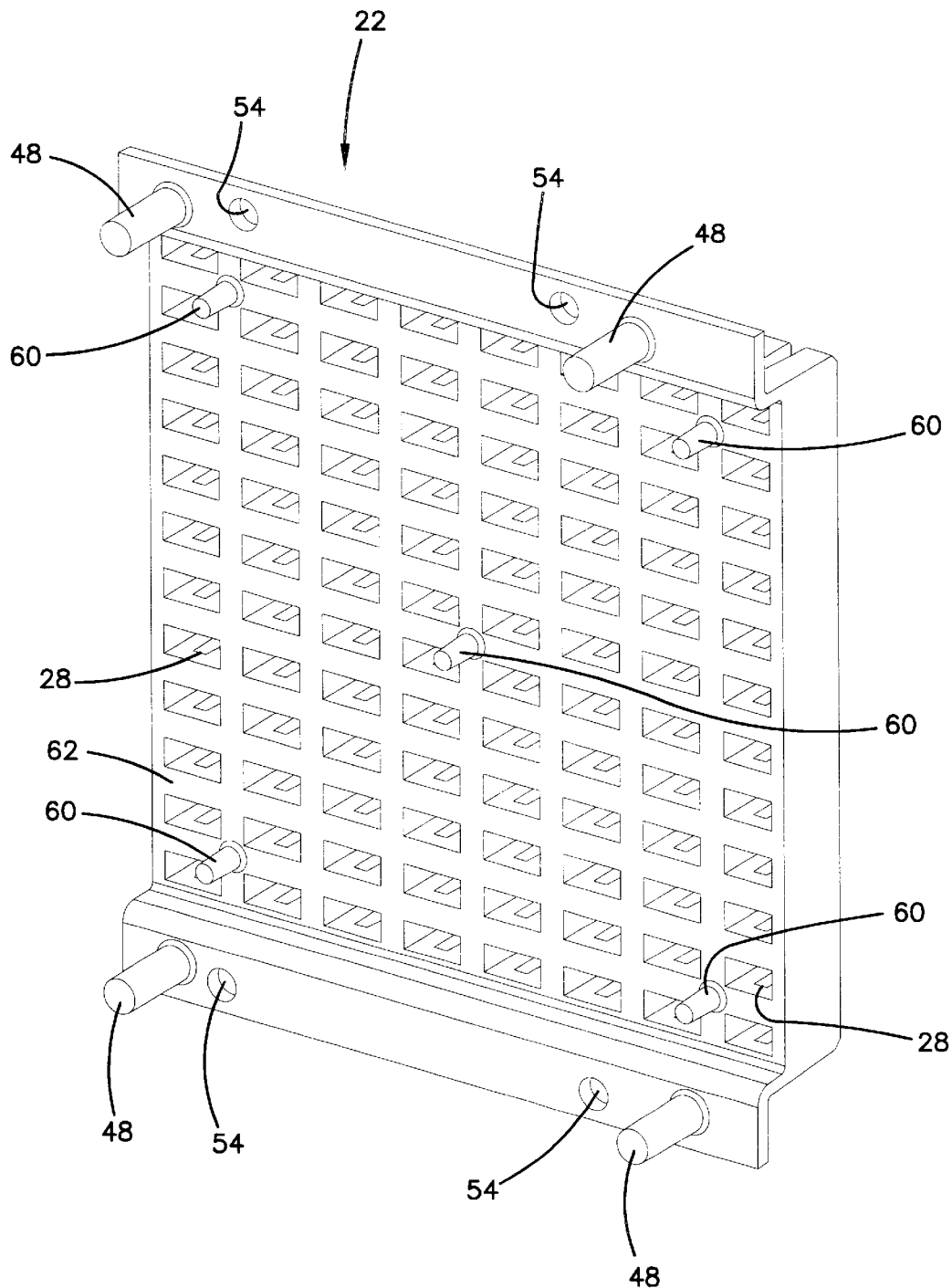
FIG. 21 is a perspective view showing back, top, left sides of the front cover of FIG. 1.
Figure 22:
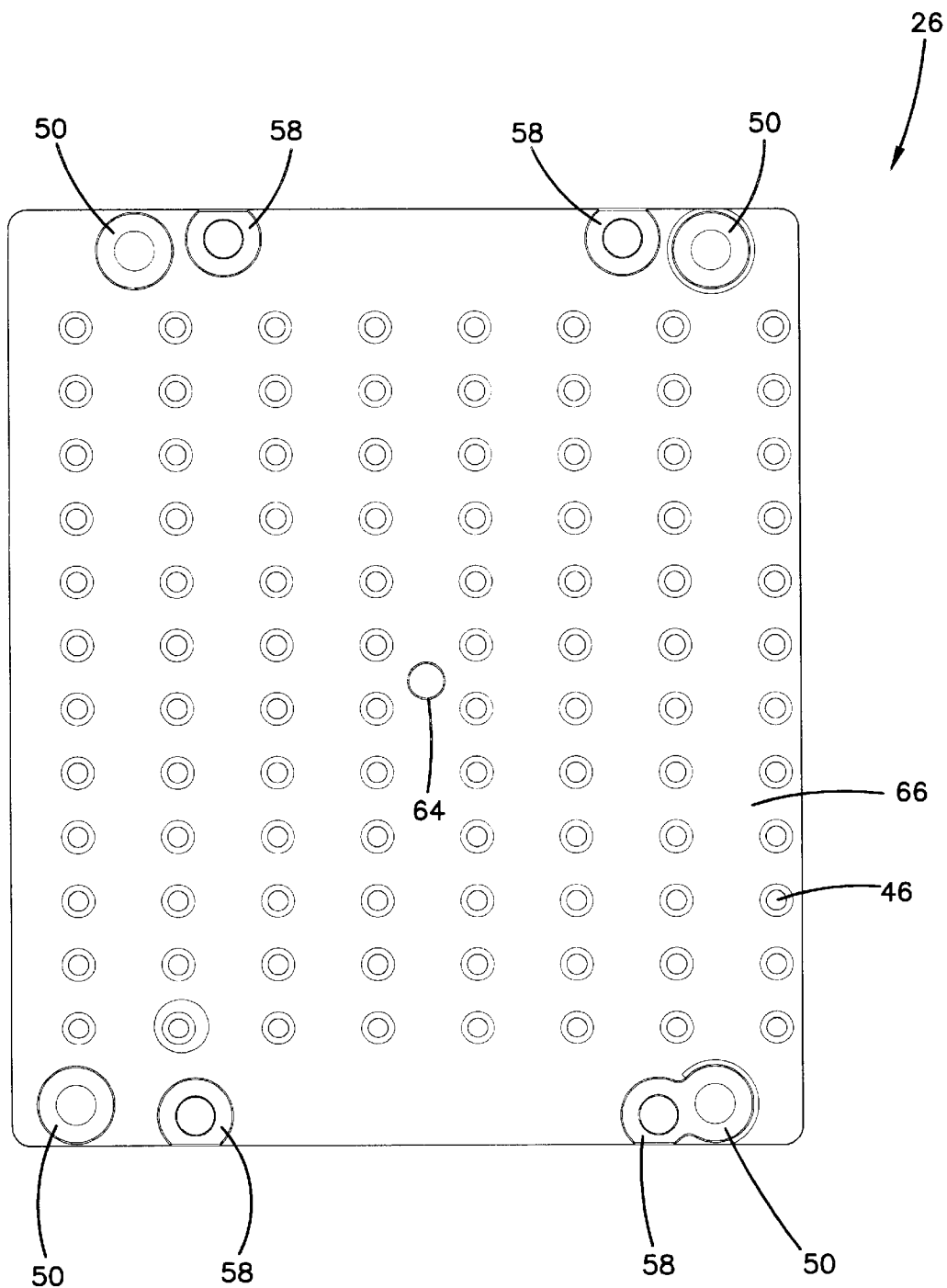
FIG. 22 is a front side view of one embodiment of the back cover of FIG. 1.

Referring now to FIGS. 1–7 and 16–26, the spring contacts 30 are retained in a first set of through holes 32, FIG. 7, of a board 25 of the circuit board assembly 24. The spring contacts 30 are disposed in columns, each column receiving a set of electrical contacts (not shown) of a jack circuit board 600, illustrated and described in connection with FIG. 36. A first end 34 of each spring contact 30 is extended towards and exposed in a corresponding receptacle 28 of the front cover 22 and stopped by the front cover 22, and a second end 36 of each spring contact 30 is extended towards and stopped by the back cover 26.

A plurality of wire wrap pins 38 are retained in a second set of through holes 40, FIG. 7, of the board 25 of the circuit board assembly 24. A first end 42 of each pin 38 is extended towards and stopped by the front cover 22, and a second end 44 of each pin 38 is extended towards and projected from a corresponding through hole 46 of the back cover 26. Thus when wires are wrapped to the pins 38, the front cover 22 prevents the pins from being pushed through or out of the circuit board 25.

A trace (not shown) generally disposed on the board 25 electrically connects each spring contact 30 to each corresponding pin 38, such that the spring contact 30 and the pin 38 are physically separate from each other yet electrically in contact via the trace on the board 25. Accordingly, in assembly, the electrical contacts of the jack circuit board 600 are electrically connected to the spring contacts 30 of the circuit board assembly 24 at one side, and electrical cables or wires are electrically connected to the wire wrap pins 38 of the circuit board assembly 24 at the other side.

The front cover 22 and the back cover 26 further include a plurality of mating male and female members 48, 50 to press fit the front cover 22 and the back cover 26 together, sandwiching the board assembly 24 there between. The board 25 of the circuit board assembly 24 further includes a plurality of holes 52 through which the mating male members 48 extend towards the mating female members 50 so that the circuit board assembly 24 is securely sandwiched between the front cover 22 and the back cover 26.

Figure 32:
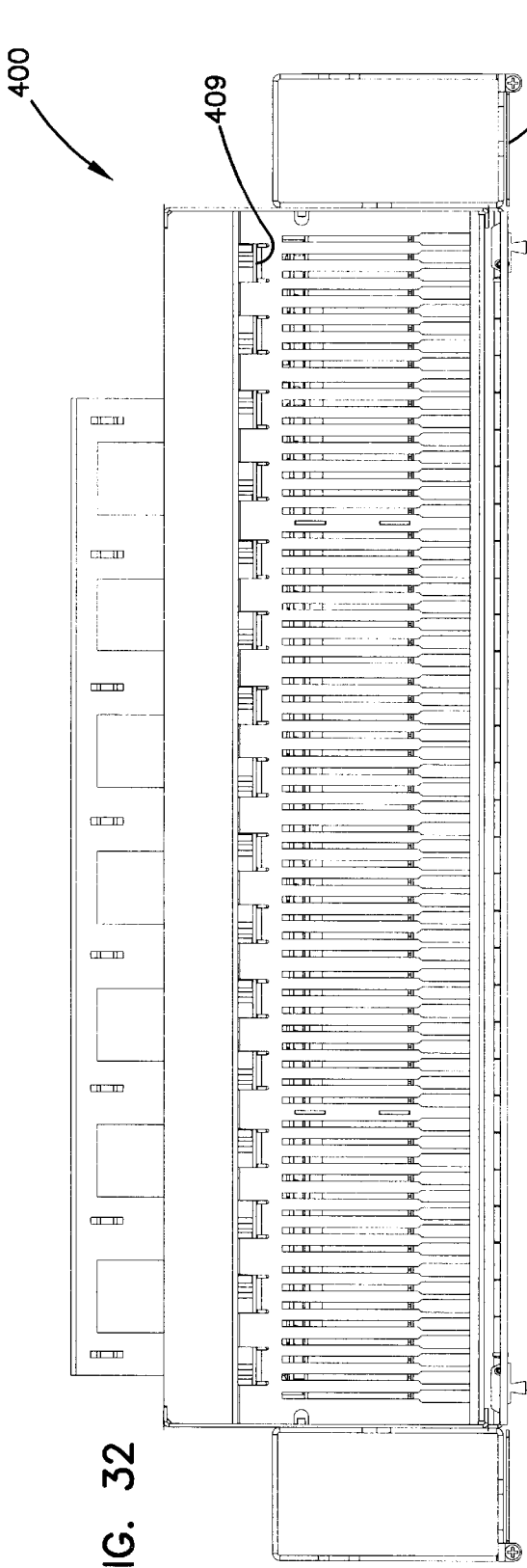
FIG. 32 is a top view of a chassis used to retain the mount apparatus of FIG. 1.
Figure 33:
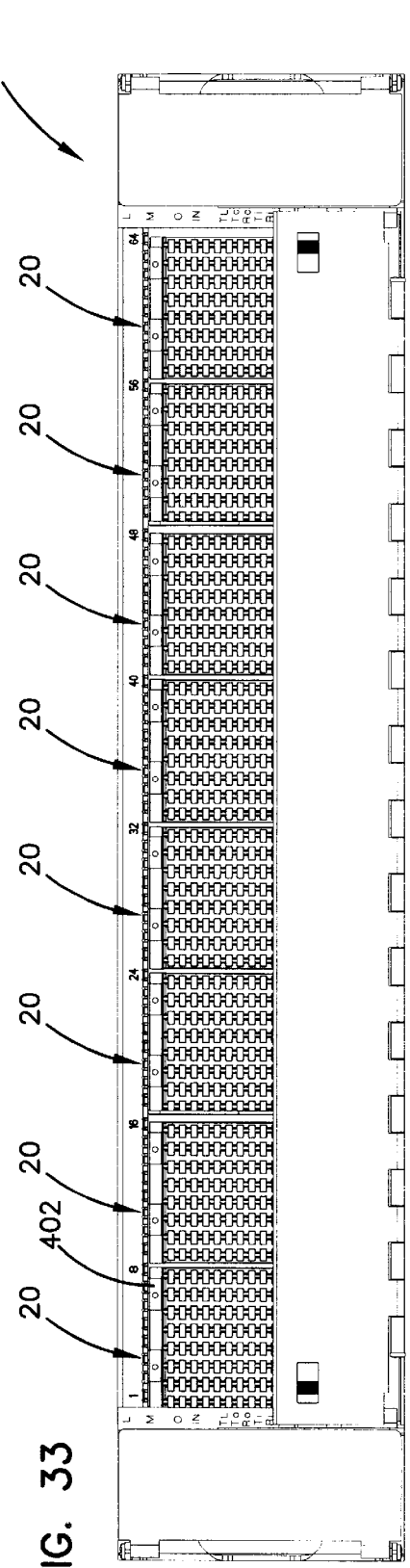
FIG. 33 is a front view of the chassis of FIG. 32.
Figure 34:
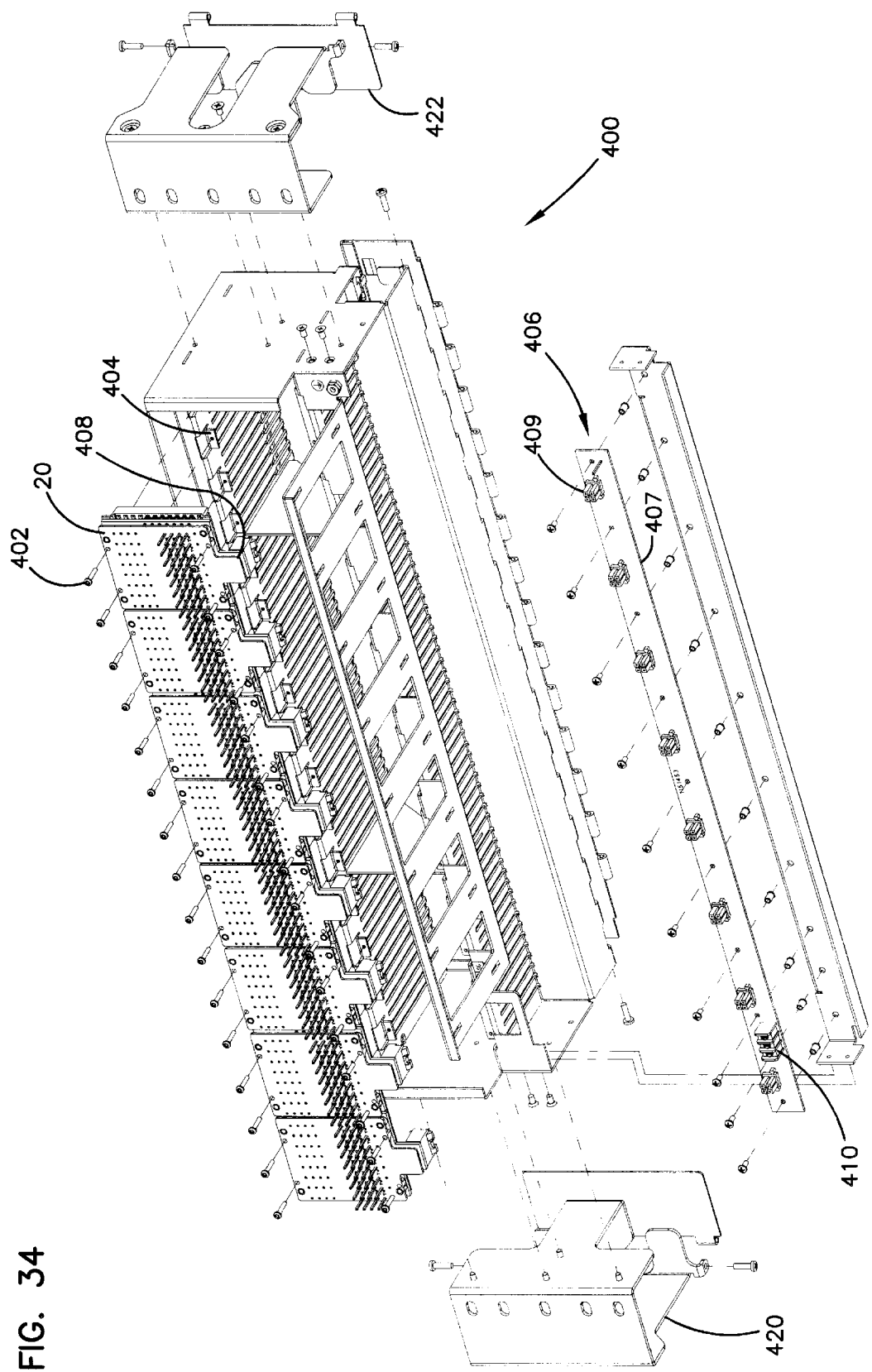
FIG. 34 is an exploded view of the chassis of FIG. 32.
Figure 35:
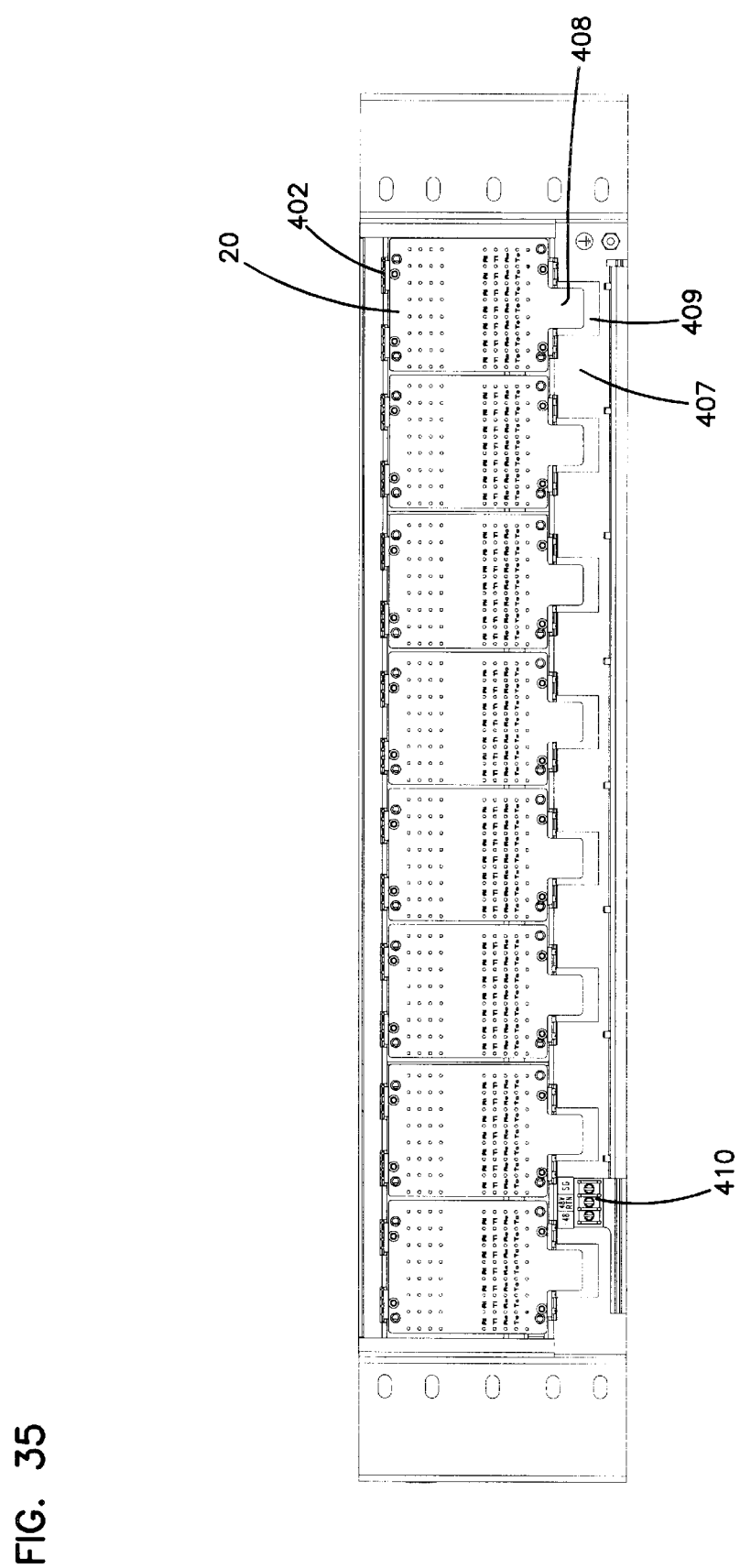
FIG. 35 is a rear view of the chassis of FIG. 32.

The front cover 22, the board 25, and the back cover 26 further include a plurality of through holes 54, 56, 58, respectively. The through holes 54, 56, 58 are aligned to each other to allow the mount apparatus 20 to be mounted in a frame, or chassis 400 as shown in FIGS. 32–34.

Referring to FIGS. 32–36, the chassis 400 is configured to retain a plurality of mount apparatuses 20 as illustrated. Screws 402 are inserted through the through holes 54, 56, 58 and are attached in retention holes 404, retaining the mount apparatus 20 in the chassis 400. The chassis 400 also includes a power bus 406 that provides power to the mount apparatuses 20 during operation. The power bus 406 includes a power strip 407, a plurality of power receptacles 409, and a power intake 410. The power bus 406 receives power through the power intake 410. The power strip 407 transfers power to the power receptacles 409. Referring back to FIG. 1, the mount apparatus includes a power plug 408. The power plug is arranged and configured to be received by the power receptacle 409 in the chassis 400 of FIG. 34. The mount apparatus 20 is inserted or plugged into the chassis 400. Thus, the mount apparatus 20 is powered by the power bus 406. Each mount apparatus 20 of the plurality of mount 20 apparatuses is individually powered, such that if one mount apparatus 20 is removed from the chassis 400, the remaining mount apparatuses 20 still receive electrical power from the power bus 406 through their respective power plugs 408. The mount apparatuses 20 are powered to provide tracing abilities for troubleshooting. The chassis 400 also includes first and second cable guides 420, 422 for handling a plurality of cables.

Referring now to FIG. 36, the assembled chassis 400 is illustrated in perspective view. A plurality of jack assemblies 600 can now be inserted and electrically connected into the chassis 400. The jack assembly 600 is retained in slots 602 within the chassis frame 604. Electrical contacts 606 are inserted into the spring contacts 30 of the mount apparatus 20, providing electrical communication between the jack assembly 600 and the mount apparatus 20.

The front cover 22 includes a plurality of spacers 60 disposed on a backside 62 of the front cover 22, which extend toward the board 25 of the circuit board assembly 24. The spacers 60 provide clearance or space for the spring contacts 30 disposed therein. It is noted that the numbers, location, size, shape of the spacers 60 can be varied without departing from the present disclosure.

The back cover 26 also includes a spacer 64 disposed on a front side 66 of the back cover 26, which extend towards the board 25 of the circuit board assembly 24. The spacer 64, mating members 50, and members 68 that define the through holes 58, provide clearance or space for the wire wrap pins 38 disposed therein. It is appreciated that the numbers, location, size, shape of the spacer 64, mating members 50, and the members 68 can be varied without departing from the present disclosure.

Figure 26:
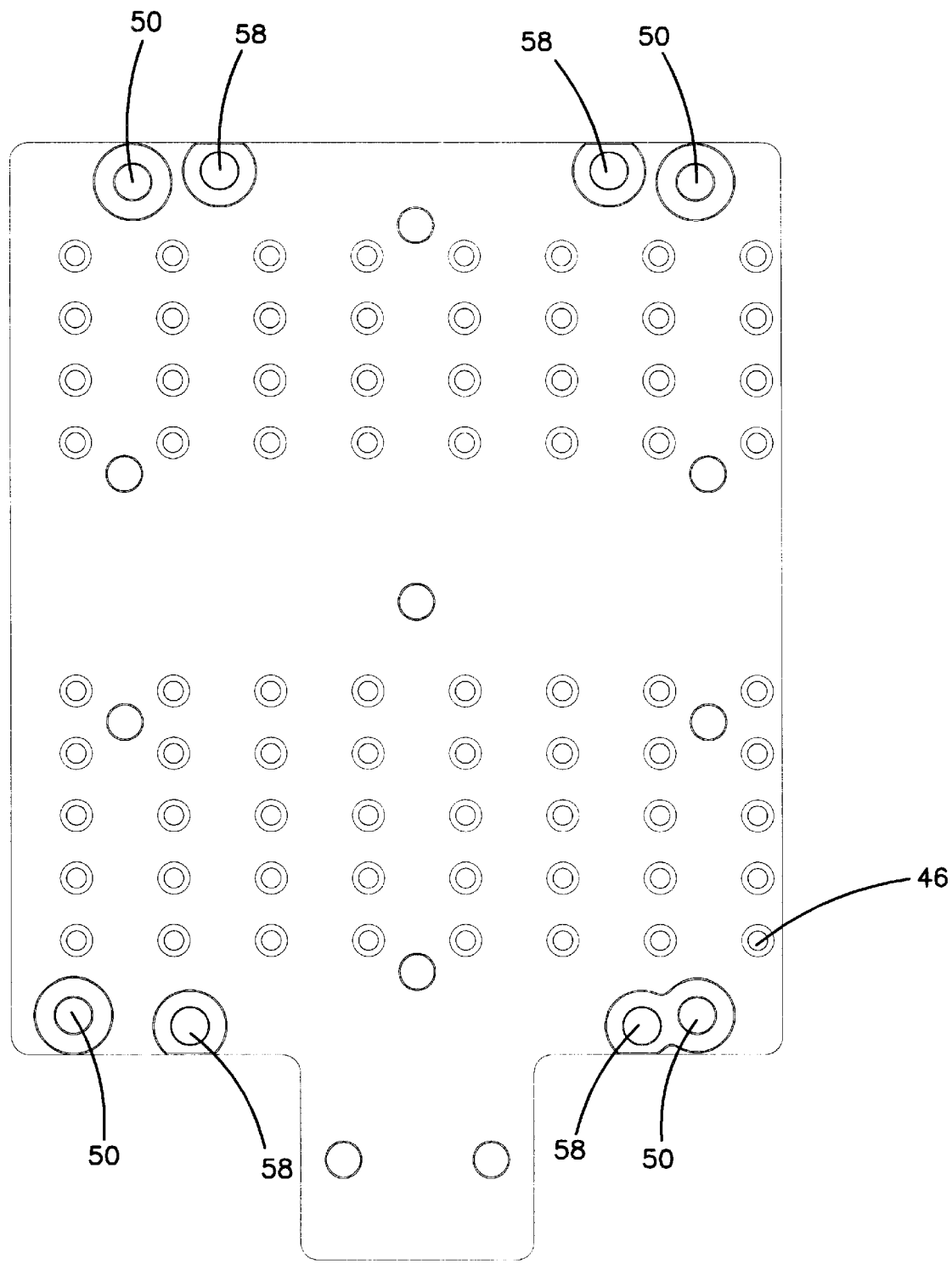
FIG. 26 is a backside view of the back cover of FIG. 23 showing one embodiment of ring-and-tip plug-in ports.

FIG. 26 also illustrates an example embodiment of the through holes 46 from a back side view of the back cover 26, whereby the through holes 46 are marked as ring-and-tip plug-in ports.

Now referring to FIGS. 8–13, each contact 30 includes a pair of spring arms 70, 72. The contact 30 has a first contact section 74 proximate to the first end 34 of the spring arms 70, 72. The first contact section 74 of the two spring arms 70, 72 is spring-biased against each other in a normal mode. The first end 34 of the spring arm 70, 72 is configured to be a receiving end for receiving an electrical contact, for example, the electrical contact 600 of the jack circuit board 600.

The contact 30 also has a second contact section 76 proximate the second end 36 of the spring arms 70, 72. The second contact section 76 of the two spring arms 70, 72 is spring-biased against each other in an operation mode where the first end 34 of the spring arms 70, 72 receive the electrical contact, for example, the electrical contact 600 of a jack circuit board 600.

The contact 30 further includes a third contact section 78 proximate a middle portion 80 of the spring arms 70, 72. The third contact section 78 of the two spring arms 70, 72 is spring-biased against each other in the operation mode where the first end 34 of the spring arms 70, 72 receive the electrical contact, for example, the electrical contact 606 of a jack circuit board 600.

The spring arms 70, 72 might include two pieces 82, 84 that are integral to each other at the middle portion 80 of the spring arms 70, 72 and split from each other at the first end 34 of the spring arms 70, 72. The two pieces 82, 84 of each spring arm 70, 72 provide resiliency of the spring arm and ensure proper contact between the contact 30 and the electrical contact, for example, the electrical contact of a jack circuit board.

The contact 30 further includes first, second, and third stop members 86, 88, 90. The first stop member 86 is integrally connected to the spring arm 70 proximate the middle portion 80 of the contact 30. The third stop member 90 is integrally connected to the spring member 72 proximate the middle portion 80 of the contact 30. The second stop member 88 is integrally connected to both of the spring arms 70, 72. The first and third stop members 86, 90 are oriented parallel to each other, and the second stop member 88 is oriented perpendicular to the first and second members 86, 90. The first, second, and third stop members 86, 88, 90 are integrally connected to the third contact section 78 proximate the middle portion 80 of the contact 30 and extended along a longitudinal axis 92 of the contact 30. The stop members 86, 88, 90 define a shoulder surface 94.

The stop members 86, 88, 90 are disposed between the front cover 22 and the circuit board assembly 24 and are capable of preventing the contact 30 from being pushed out of the through hole 32 of the board 25 from the front cover 22 side. The shoulder surface 94 is disposed between the front cover 22 and the circuit board assembly 24 and is capable of preventing the contact 30 from being pushed out of the through hole 32 of the board 25 from the back cover 26 side.

Now referring to FIGS. 14 and 15, the pin 38 includes a pair of enlarged sections 92, 93 and a pair of recessed sections 94 (one is shown in FIG. 14, and the other one is in mirror image of the one shown). The enlarged sections 92, 93 are disposed on first and second sides 94, 96 of the pin 38, respectively. The recessed sections 94 are disposed on third and fourth sides 98, 100 of the pin 38, respectively. Each of the enlarged sections 92, 93 is disposed next to each of the recessed sections 94, and the enlarged sections 92 and the recessed sections 94 are disposed proximate the first end 42 of the pin 38. A portion of the enlarged sections 92 and the recessed sections 94 are press-fit in the through hole 40 of the board 25.

The first end 42 of the pin 38 is disposed adjacent to the front cover 22. The front cover 22 is arranged and configured such that the front cover 22 is capable of preventing the pin 38 from being pushed out from the front cover 22 side.

The front and back covers 22, 26 are preferably made of a plastic material. The board 25 of the circuit board assembly 24 is preferably made of a plastic material. It is appreciated that other materials can be used within the scope of the present invention.

Referring back to FIG. 36, in use, the operator slides a selected jack 600 into the chassis 400 where the electrical contacts of the jack circuit board are received by the front cover 22 wherein the electrical contacts 606 of the jack circuit board 600 are coupled to a column of spring contacts 30 of the circuit board assembly 24. The operator couples a first cable to a termination pin of a jack circuit board 606. The operator couples a second cable to the wire wrap pin 38 retained on the circuit board assembly 24 that extends from a back side of the back cover 26. The circuit can be accessed through the ports on the front of the jack 600.

Figure 27:
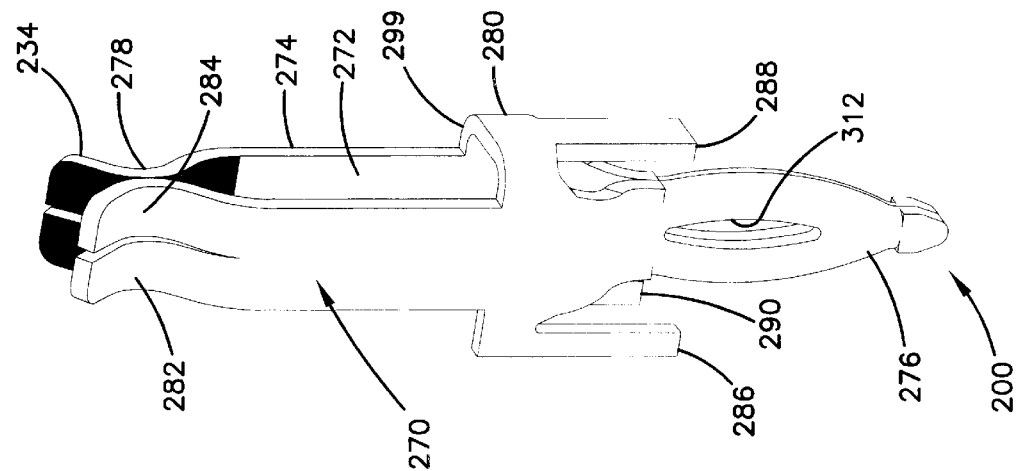
FIG. 27 is a perspective view of an example embodiment illustrating front, top, and right sides of another embodiment of a spring contact of the circuit board assembly of FIG. 5.
Figure 28:
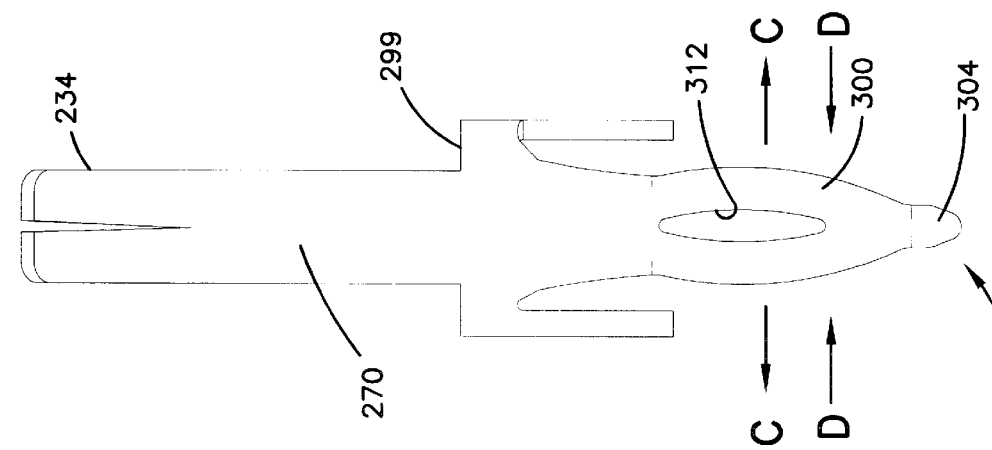
FIG. 28 is a front view of the spring contact of FIG. 27.
Figure 29:
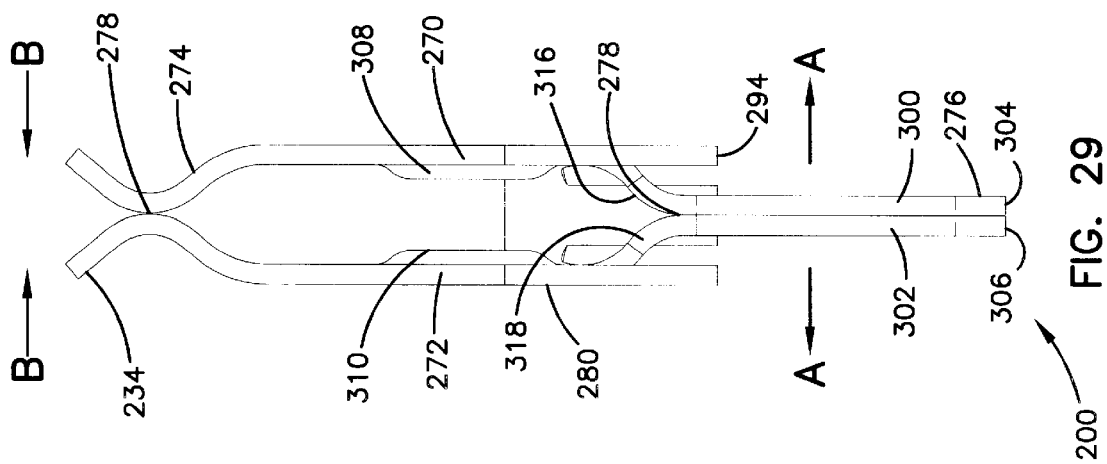
FIG. 29 is a side view of the spring contact of FIG. 27.
Figure 31:
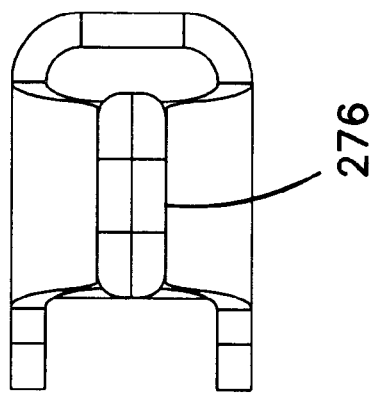
FIG. 31 is a bottom side view of the spring contact of FIG. 27.
Figure 30:
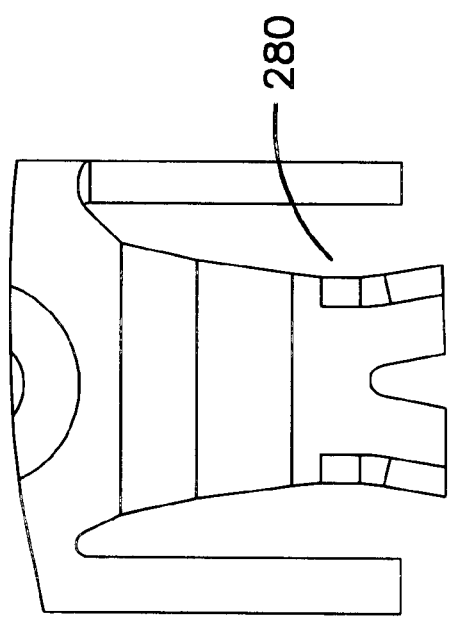
FIG. 30 is an enlarged view of a middle portion of the spring contact of FIG. 27.

Now referring to FIGS. 27–29, another example embodiment of a spring contact 200 is illustrated. The contact 200 includes a first section 274, a second section 276, and third section 280. The first section 274 includes first and second spring arms 270, 272. The first section 274 is configured to be a receiving end for receiving an electrical contact, for example, the electrical contact 606 of a jack circuit board 600. The first and second spring arms, 270, 272 are proximate to each other at a contact point 278. The electrical contact is inserted between the contact point 278. The first and second spring arms 270, 272 exert a first spring force B at a first end 234 of the contact 200 at the contact point 278 sufficient to retain the electrical contact.

The first and second spring arms 270, 272 include first and second pieces 282, 284 that are integral to each other at the third section 280 of the contact 200 and split from each other at the first end 234 of the spring arms 270, 272. The first and second pieces 282, 284 of each spring arm 270, 272 provide resiliency to the spring arm and ensure proper contact between the contact 200 and the electrical contact, for example, the electrical contact 606 of a jack circuit board 600.

The first section 274 also includes first and second ribs 308, 310 attached to or integral with the first and second spring arms 270, 272, respectively. The first and second ribs 308, 310 strengthen the first and second spring arms 270, 272, respectively, and increase the retention function of the first section 274.

The second section 276 is proximate a second end 236 of the contact 200. The second section 276 includes first and second pin members 300, 302. Typically, the first and second pin members 300, 302 are proximate to each other, or, in other words, there is not a space between the first and second pin members 300, 302. Thus, there is not a spring force exerted in direction A. This is advantageous because a spring force exerted in direction A reduces the spring force exerted in direction B at the first section 274, and therefore, reduces the ability of the first section 274 to retain an electrical contact. By having a third section 278 that does not exert a spring force in the first direction A, the retention ability of the first section 274 is increased.

Preferably, the first and second pin members 300, 302, include first and second end sections 304, 306, respectively. The first and second end sections 304, 306 are configured as bull noses as illustrated. This configuration is advantageous because it facilitates insertion of the contact 200 into the board 25, FIG. 1.

Typically, the first and second pin members 300, 302, include first and second transition sections 316, 318, respectively. The first and second transition sections 316, 318 are configured to maintain the first and second pin members 300, 302 as illustrated in FIG. 29. In other words, the first and second transition sections 316, 318 are configured such that there is not a space between the first and second pin members 300, 302 for reasons discussed previously.

The first and second pin members 300, 302 define first and second slots 312, 314, respectively. Typically, the first and second slots are configured as elliptical slots; however, any suitable shape can be used. The first and second slots are designed to exert a spring force in direction C, as illustrated. Upon insertion of the contact 200 into a board 25, FIG. 1, the first and second pin sections 300, 302 are compressed in a direction D. The resilience of the first and second pin sections 300, 302 exert the spring force in the direction C as the first and second pin sections attempt to uncompress. It is noted that the spring force exerted in the direction C is perpendicular to the spring force exerted by the first section 274 in direction B. Thus, the spring force in direction C does not reduce the spring force in direction B.

The contact 200 further includes a third section 280. The third contact section 280 is a transition area between the first contact section 274 and the second contact section 276 of the contact 200. The third section 280 includes first, second, and third stop members 286, 288, 290. The first, second, and third stop members 286, 288, 290 are integrally connected to the contact 200 proximate the middle portion 280 of the contact 200. The first, second, and third stop members 286, 288, 290 are oriented parallel to each other. The stop members 286, 288, 290 define a shoulder surface 294.

The stop members 286, 288, 290 are disposed between the front cover 22, FIG. 1, and the circuit board assembly 24, FIG. 1, and are capable of preventing the contact 200 from being pushed out of the through hole 32 of the board 25 from the front cover 22 side. The shoulder surface 294 is disposed between the front cover 22 and the circuit board assembly 24 and is capable of preventing the contact 200 from being pushed out of the through hole 32 of the board 25 from the back cover 26 side.

The third section 280 also includes a push surface 299. The push surface 299 facilitates insertion of the contact 200 into the circuit board assembly 25. An insertion tool can use the push surface 299 to apply force to the contact 200 for insertion without comprising any of the other aspects or components of the contact 200.

The various embodiments described above are provided by way of illustration only and should not be construed to limit the invention. Those skilled in the art will readily recognize various modifications and changes that may be made to the present invention without following the example embodiments and applications illustrated and described herein, and without departing from the true spirit and scope of the present invention, which is set forth in the following claims.

What is claimed is:

1. A mount apparatus for use in a cross-connect system, comprising:
   a front cover having a plurality of receptacles;
   a back cover having a plurality of through holes;
   a circuit board assembly sandwiched between the front cover and the back cover, the circuit board assembly comprising:
   a board having a plurality of through holes aligned with the receptacles of the front cover and the through holes of the back cover;
   a plurality of contacts retained in a first set of the through holes of the board of the circuit board assembly, a first end of each contact being extended towards and exposed in a corresponding receptacle of the front cover and stopped by the front cover, a second end of each contact being extended towards and projecting toward the back cover;
   a plurality of pins retained in a second set of the through holes of the board of the circuit board assembly, a first end of each pin being extended towards and stopped by the front cover, a second end of each pin being extended towards and projected from a corresponding through hole of the back cover; and
   a trace electrically connecting each contact to each corresponding pin.

2. The apparatus of claim 1, wherein the receptacles of the front cover form a plurality of arrays of channels.

3. The apparatus of claim 1, wherein the front and back covers are made of a plastic material.

4. The apparatus of claim 1, wherein the plurality of contacts include:
   a first section that receives an electrical contact, the first section including first and second spring arms proximate to each other at a contact point and configured to exert a first spring force to retain the electrical contact;
   a second section adapted for insertion into the through hole of the circuit board, the second section including first and second pin members proximate to each other and defining slots configured to exert a second spring force to retain the electrical terminal in the through hole of the circuit board, the second spring force being exerted in a direction perpendicular to the first spring force; and
   a third section integral with the first and second sections.

5. The apparatus of claim 1, wherein the plurality of contacts include:
   a first section that receives an electrical contact;
   a second section adapted for insertion into the through hole of the circuit board, the second section including first and second pin members proximate to each other and defining slots configured to exert a spring force to retain the electrical terminal in the through hole of the circuit board; and
   a third section integral with the first and second sections, the third section including a plurality of stop members configured to prevent the electrical terminal from being pushed through the through hole of the circuit board.

6. The apparatus of claim 1, wherein the front and back covers further comprise mating male and female members to press fit the front and back covers together.

7. The apparatus of claim 6, wherein the circuit board assembly further comprises a hole through which the mating male member extends towards the mating female member so that the circuit board assembly is sandwiched between the front and back covers.

8. The apparatus of claim 1, wherein each pin comprises a pair of enlarged sections disposed on first and second sides of the pin, respectively, and a pair of recessed sections disposed on third and fourth sides of the pin, respectively, each of the enlarged sections being disposed next to each of the recessed sections, the enlarged sections and the recessed sections being disposed proximate the first end of the pin, a portion of the enlarged sections and the recessed sections being press-fit in the through hole of the board.

9. The apparatus of claim 8, wherein the first end of the pin is disposed adjacent to the front cover, and the front cover is arranged and configured such that the front cover is capable of preventing the pin from being pushed out from a front cover side.

10. The apparatus of claim 1, wherein each contact comprises a pair of spring arms, each spring arm having a first contact section proximate a first end of the spring arm, the first contact section of the two spring arms being spring-biased against each other in a normal mode, and the first end of the spring arms being configured to be a receiving end for receiving an electrical contact.

11. The apparatus of claim 10, wherein each spring arm has a second contact section proximate a second end of the spring arm, the second contact section of the two spring arms being spring-biased against each other in an operation mode where the first end of the spring arms receives the electrical contact.

12. The apparatus of claim 11, wherein each spring arm has a third contact section proximate a middle portion of the spring arm, the third contact section of the two spring arms being spring-biased against each other in the operation mode where the first end of the spring arms receives the electrical contact.

13. The apparatus of claim 12, wherein the contact further comprises a stop member integrally connected to the third contact section of the two spring arms and extended along a longitudinal axis of the contact, the stop member being disposed between the front cover and the board and being capable of preventing the contact from being pushed out of the through hole of the board either from a front cover side or from a back cover side.

14. A mount apparatus comprising:
a front cover having a plurality of receptacles;
a back cover having a plurality of through holes; and
a circuit board assembly sandwiched between the front cover and the back cover, the circuit board assembly comprising:
a board having a plurality of through holes aligned with the receptacles of the front cover and the through holes of the back cover;
a plurality of contacts retained in a first set of the through holes of the board of the circuit board assembly, a first end of each contact being extended towards and exposed in a corresponding receptacle of the front cover and stopped by the front cover, a second end of each contact being extended towards and projecting toward the back cover.

* * * * *